US012751018B2

(12) United States Patent
Lin et al.

(10) Patent No.: US 12,751,018 B2
(45) Date of Patent: Sep. 29, 2026

(54) LOW CROSS-TALK NOISE RESISTIVE MEMORY DEVICES ON A SOI SUBSTRATE AND METHODS OF MAKING THE SAME

(71) Applicant: Taiwan Semiconductor Manufacturing Company Limited, Hsinchu (TW)

(72) Inventors: Kao-Chao Lin, Fanlu Township (TW); Chi-Wei Ho, Tainan (TW); Yu-Ting Tsai, Tainan (TW); Ching-Tzer Weng, Tainan City (TW); Chia-Ta Hsieh, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 367 days.

(21) Appl. No.: 18/410,082

(22) Filed: Jan. 11, 2024

(65) Prior Publication Data

US 2025/0107104 A1 Mar. 27, 2025

Related U.S. Application Data

(60) Provisional application No. 63/585,022, filed on Sep. 25, 2023.

(51) Int. Cl.
*H10B 63/00* (2023.01)
*H10P 90/00* (2026.01)
(Continued)

(52) U.S. Cl.
CPC ......... *H10B 63/30* (2023.02); *H10P 90/1908* (2026.01); *H10W 10/061* (2026.01); *H10W 10/181* (2026.01); *H10W 20/42* (2026.01)

(58) Field of Classification Search
CPC ........ H10B 63/30; H10B 63/80; H10B 63/10; H10P 90/1908; H10W 10/061;
(Continued)

(56) References Cited

U.S. PATENT DOCUMENTS 12,426,278 B2 * 9/2025 Gopinath ............... H10B 63/30
2015/0061054 A1 * 3/2015 Kim .................... G11C 11/1659 257/421

(Continued)

FOREIGN PATENT DOCUMENTS

TW 201426749 A 7/2014
TW 202038449 A 10/2020
(Continued)

OTHER PUBLICATIONS

KR Patent and Trademark Office; KR Application No. 10-2024-0123158; Notice of Allowance mailed Jun. 23, 2025; 16 pages.

(Continued)

*Primary Examiner* — Dao H Nguyen
(74) *Attorney, Agent, or Firm* — The Marbury Law Group, PLLC

(57) ABSTRACT

A semiconductor structure may include a semiconductor-on-insulator (SOI) substrate having a top semiconductor layer and a buried insulating layer. At least one moat trench may extend through the top semiconductor layer and the buried insulating layer and may laterally surround a first device region. A deep trench isolation structure may be formed within the moat trench and may include a non-insulating moat structure. A resistive memory array may be formed within the first device region, and peripheral devices may be formed outside the first device region. A metallic moat structure may laterally surround the resistive memory array. Upper-level metal interconnect structures may extend
(Continued)

over the metallic moat structure and may electrically couple the peripheral devices to the resistive memory array.

20 Claims, 21 Drawing Sheets

(51) Int. Cl.
*H10W 10/00* (2026.01)
*H10W 10/10* (2026.01)
*H10W 20/42* (2026.01)

(58) Field of Classification Search
CPC .... H10W 10/181; H10W 20/42; H10N 70/20; H10N 70/011; H10N 70/826; H10N 70/881
See application file for complete search history.

(56) References Cited

U.S. PATENT DOCUMENTS

| | | | | |
|---|---|---|---|---|
| 2015/0155360 | A1 | 6/2015 | Kim et al. | |
| 2018/0175022 | A1* | 6/2018 | Weber | H10N 70/011 |
| 2018/0261530 | A1* | 9/2018 | Sekikawa | H10W 10/021 |
| 2019/0206449 | A1 | 7/2019 | Beigel et al. | |
| 2020/0227436 | A1 | 7/2020 | Wang | |
| 2020/0258572 | A1 | 8/2020 | Bandyopadhyay et al. | |
| 2020/0286528 | A1 | 9/2020 | Beigel et al. | |
| 2021/0358890 | A1 | 11/2021 | Hu | |
| 2021/0384093 | A1* | 12/2021 | Verma | H10W 74/131 |
| 2022/0020920 | A1* | 1/2022 | Chen | H10N 50/10 |
| 2022/0223625 | A1* | 7/2022 | Chiang | H10D 86/201 |
| 2023/0010799 | A1 | 1/2023 | Xu et al. | |
| 2023/0290768 | A1 | 9/2023 | Lee et al. | |
| 2024/0063278 | A1* | 2/2024 | Iwata | H10D 64/514 |

FOREIGN PATENT DOCUMENTS

| | | | |
|---|---|---|---|
| TW | 202201647 | A | 1/2022 |
| TW | 202213827 | A | 4/2022 |
| TW | 202303942 | A | 1/2023 |
| TW | 202308129 | A | 2/2023 |

OTHER PUBLICATIONS

Jianq Chyun Intellectual Property Office; TW Application No. 113107673; Office Action mailed Jan. 8, 2025; 12 pages.

* cited by examiner

LOW CROSS-TALK NOISE RESISTIVE MEMORY DEVICES ON A SOI SUBSTRATE AND METHODS OF MAKING THE SAME

RELATED APPLICATIONS

This application claims the benefit of priority from U.S. Provisional Application Ser. No. 63/585,022 titled "A novel method of low cross-talk noise RRAM devices by poly plug deep trench Isolation on SOI" and filed on Sep. 25, 2023, the entire contents of which are incorporated herein by reference.

BACKGROUND

Resistive memory devices are susceptible to malfunction due to external noises, such as electromagnetic interference and voltage fluctuations. Operational voltages, manufacturing quality, and the device's operating environment also impact the sensitivity of resistive memory devices to external noise.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
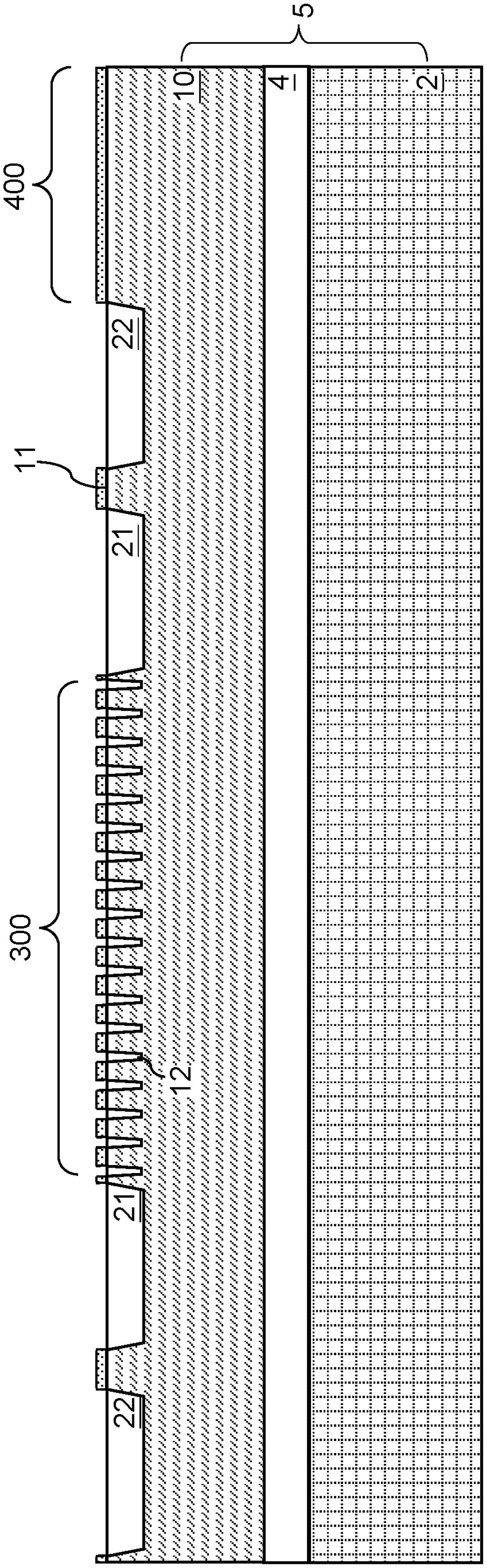
FIG. 1A is a vertical cross-sectional view of a first configuration of an exemplary structure after formation of shallow trench isolation structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. Drawings are not drawn to scale. Elements with the same reference numerals refer to the same element, and are presumed to have the same material composition and the same thickness range unless expressly indicated otherwise. Embodiments are expressly contemplated in which multiple instances of any described element are repeated unless expressly stated otherwise. Embodiments are expressly contemplated in which non-essential elements are omitted even if such embodiments are not expressly disclosed but are known in the art.

Ordinals such as "first," "second," "third," etc. are generally not a part of a noun that refers to an element, but are merely adjectives. As such, same elements may be referred to with different ordinals across the specification and the claims. Further, whenever multiple elements and/or similar elements are present, such multiple elements and/or similar elements may be numbered in any order. Thus, the possibility of numbering elements with different ordinals are expressly contemplated for each case in which a plurality of elements is present. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Operation of resistive random access memory (RRAM) devices, particularly in instances in which the RRAM devices are used in conjunction with high voltage devices or circuits, has raised concerns regarding cross-talk noise interference. Susceptibility to external noise could compromise the reliability of the operation of RRAM devices. In the present disclosure, semiconductor structures are disclosed in which RRAM devices are electrically shielded by a buried insulating layer of a semiconductor-on-insulator substrate, at least one deep trench isolation structure, and optionally with at least one metallic moat structure. A plurality of nested deep trench isolation structures and/or a plurality of metallic moat structures may be used. Cross-talk noise originating from the surrounding environment, particularly from high voltage devices and circuits, may be suppressed by the various structures of the present disclosure. Devices of the present disclosure may be used in memory devices that are subjected to a high level of electrical noise, such as, but not limited to, memory devices used in the automotive industry.

Figure 1B:
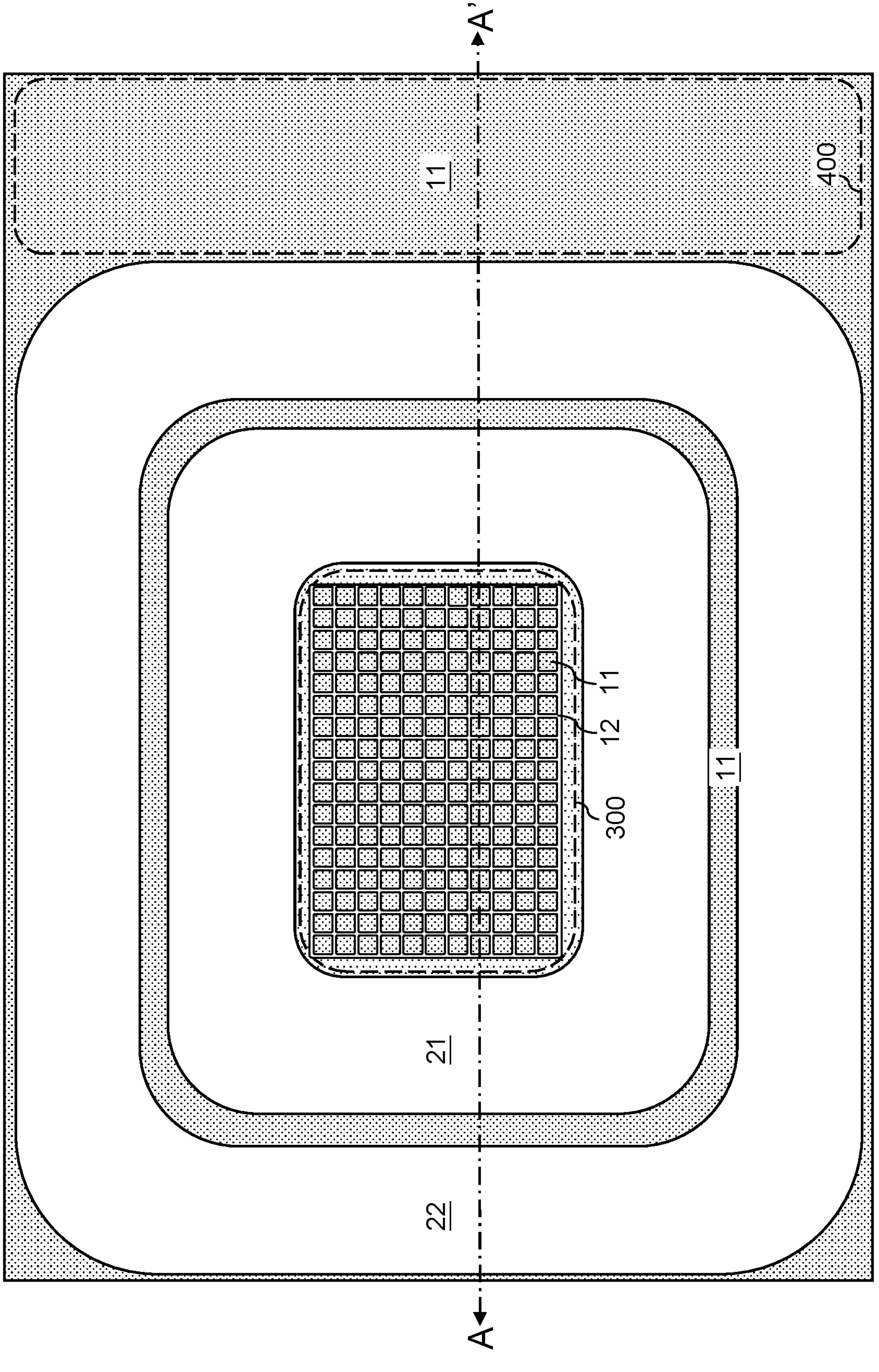
FIG. 1B is a top-down view of the exemplary structure of FIG. 1A. The vertical plane A-A' is the cut plane of FIG. 1A.

Referring to FIGS. 1A and 1B, a first configuration of an exemplary structure according to an embodiment of the present disclosure is illustrated. The first configuration of the exemplary structure comprises a semiconductor-on-insulator (SOI) substrate 5 that includes, from bottom to top, a handle substrate 2, a buried insulating layer 4, and a top semiconductor layer 10. The handle substrate 2 may have a thickness in a range from 300 microns to 1 mm, although lesser and greater thicknesses may also be used. In one embodiment, the handle substrate 2 may comprise a semiconductor substrate including a single crystalline semiconductor material such as single crystalline silicon. The buried insulating layer 4 comprises an insulating material such as silicon oxide, and may have a thickness in a range from 100 nm to 1,000 nm, although lesser and greater thicknesses may also be used. The top semiconductor layer 10 comprises a single crystalline semiconductor material such as single crystalline silicon. The thickness of the top semiconductor layer 10 may be in a range from 500 nm to 2,000 nm, although lesser and greater thicknesses may also be used.

A first pad dielectric layer 11 may be formed over the top surface of the top semiconductor layer 10. The first pad dielectric layer 11 may comprise, for example, a silicon nitride layer. Other dielectric materials are within the contemplated scope of disclosure. A photoresist layer (not shown) may be applied over a top surface of the first pad dielectric layer 11, and may be lithographically patterned to form openings therein. An anisotropic etch process may be performed to transfer the pattern of the openings through the first pad dielectric layer 11 and into an upper portion of the top semiconductor layer 10. Shallow trenches may be formed in volumes from which the material of the top semiconductor layer 10 is removed. The photoresist layer may be removed, for example, by ashing.

A dielectric fill material such as undoped silicate glass or a doped silicate glass may be deposited in the shallow trenches. Portions of the dielectric fill material that overlies a horizontal plane including the top surface of the first pad dielectric layer 11 may be removed by performing a planarization process, which may comprise a chemical mechanical polishing process or a recess etch process. Subsequently, the dielectric fill material may be vertically recessed below the horizontal plane including the top surface of the first pad dielectric layer 11 by performing a selective etch process that etches the dielectric fill material selective to the material of the first pad dielectric layer 11. For example, if the dielectric fill material comprises silicon oxide and if the first pad dielectric layer 11 comprises silicon nitride, a wet etch process using dilute hydrofluoric acid may be performed to selectively recess the dielectric fill material.

Remaining portions of the dielectric fill material that fill the shallow trenches comprise shallow trench isolation structures (12, 21, 22). Top surfaces of the shallow trench isolation structures (12, 21, 22) may be formed at, or about, the horizontal plane including the top surface of the top semiconductor layer 10. The first pad dielectric layer 11 may be subsequently removed selective to the shallow trench isolation structures (12, 21, 22) by performing an additional selective etch process. For example, if the first pad dielectric layer 11 comprises silicon nitride, the additional selective etch process may comprise a wet etch process using hot phosphoric acid.

The shallow trench isolation structures (12, 21, 22) comprise at least one annular shallow trench fill structure (21, 22) that laterally surrounds a first device region 300 as a respective single continuous structure including a respective opening therethrough. In one embodiment, each of the at least one annular shallow trench fill structure (21, 22) may be topologically homeomorphic to a torus, i.e., may be continuously deformed without creating any additional opening therethrough and without destroying any pre-existing opening therethrough into the shape of a torus. The region of the exemplary structure that is laterally surrounded by an innermost periphery of the at least one annular shallow trench fill structure (21, 22) constitutes the first device region 300.

In one embodiment, the at least one annular shallow trench fill structure (21, 22) may comprise an inner annular shallow trench fill structure 21 and an outer annular shallow trench fill structure 22 that laterally surrounds the inner annular shallow trench fill structure 21 and is laterally offset from the inner annular shallow trench fill structure 21. The lateral spacing between an inner top periphery and an outer top periphery of the inner annular shallow trench fill structure 21 may be in a range from 500 nm to 5,000 nm, although lesser and greater lateral spacings may also be used. The lateral spacing between an inner top periphery and an outer top periphery of the outer annular shallow trench fill structure 22 may be in a range from 500 nm to 5,000 nm, although lesser and greater lateral spacings may also be used. An annular gap is present between the outer top periphery of the inner annular shallow trench fill structure 21 and the inner periphery of the outer annular shallow trench fill structure 22. A second device region 400 may be provided outside the outer periphery of the outer annular shallow trench fill structure 22.

According to an aspect of the present disclosure, the shallow trench isolation structures (12, 21, 22) may comprise a shallow trench isolation grid 12 that is formed in the first device region 300. The shallow trench isolation grid 12 may be formed within an upper region of the first portion of the top semiconductor layer 10 that is laterally surrounded by the at least one annular shallow trench fill structure (21, 22). For example, the shallow trench isolation grid 12 may comprise an M×N rectangular grid of openings therein. Each of M and N may be an integer greater than 1. For example, each of M and N may be independently in a range from 2 to 216. Portions of the top semiconductor layer 10 that are located within the openings in the shallow trench isolation grid 12 constitute active regions of field effect transistors to be subsequently formed. The shallow trench isolation grid 12 may laterally surround an array of active regions of the access transistors, which are patterned segments of the first portion of the top semiconductor layer 10. Thus, source regions and drain regions of the array of access transistors may be subsequently formed within the array of active regions. Additional shallow trench isolation structures (not illustrated) may be formed in the second device region 400, which may be used to form peripheral devices for controlling operation of a memory array to be subsequently formed in the first device region 300.

Figure 2A:
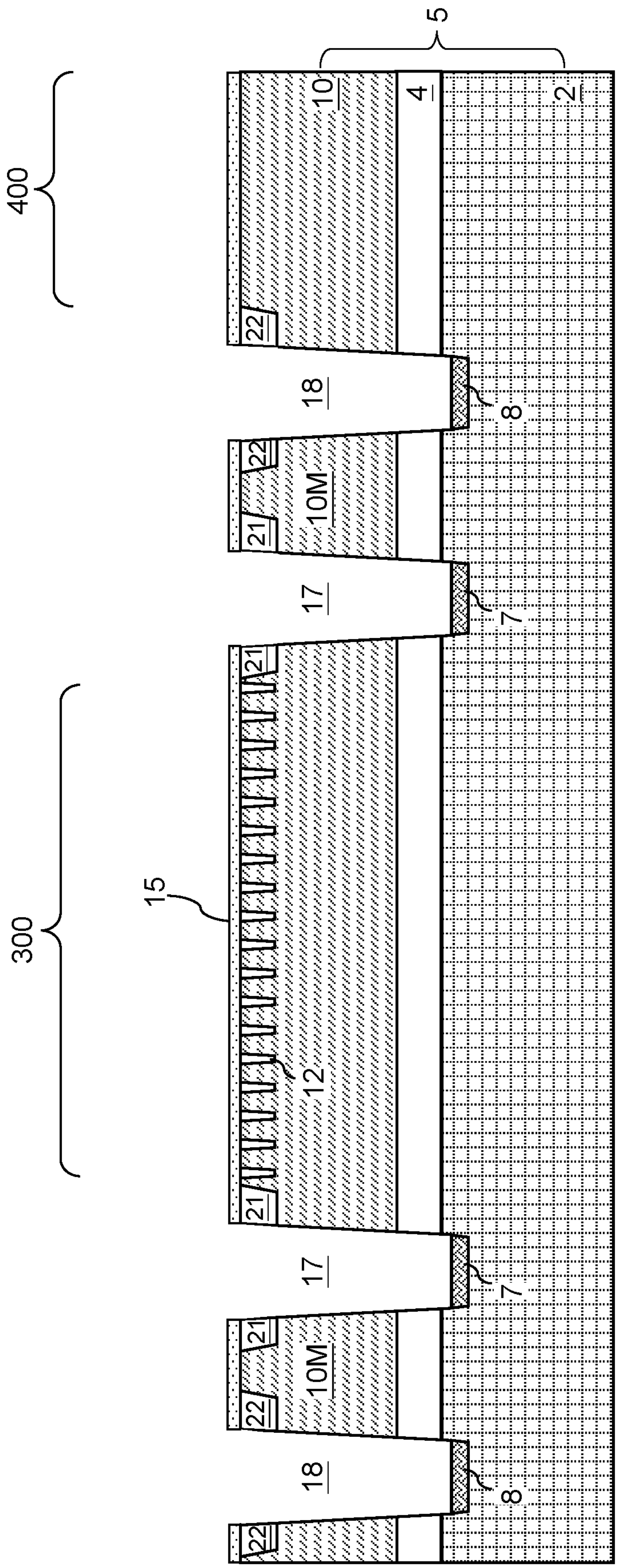
FIG. 2A is a vertical cross-sectional view of the first configuration of the exemplary structure after formation of moat trenches according to an embodiment of the present disclosure.
Figure 2B:
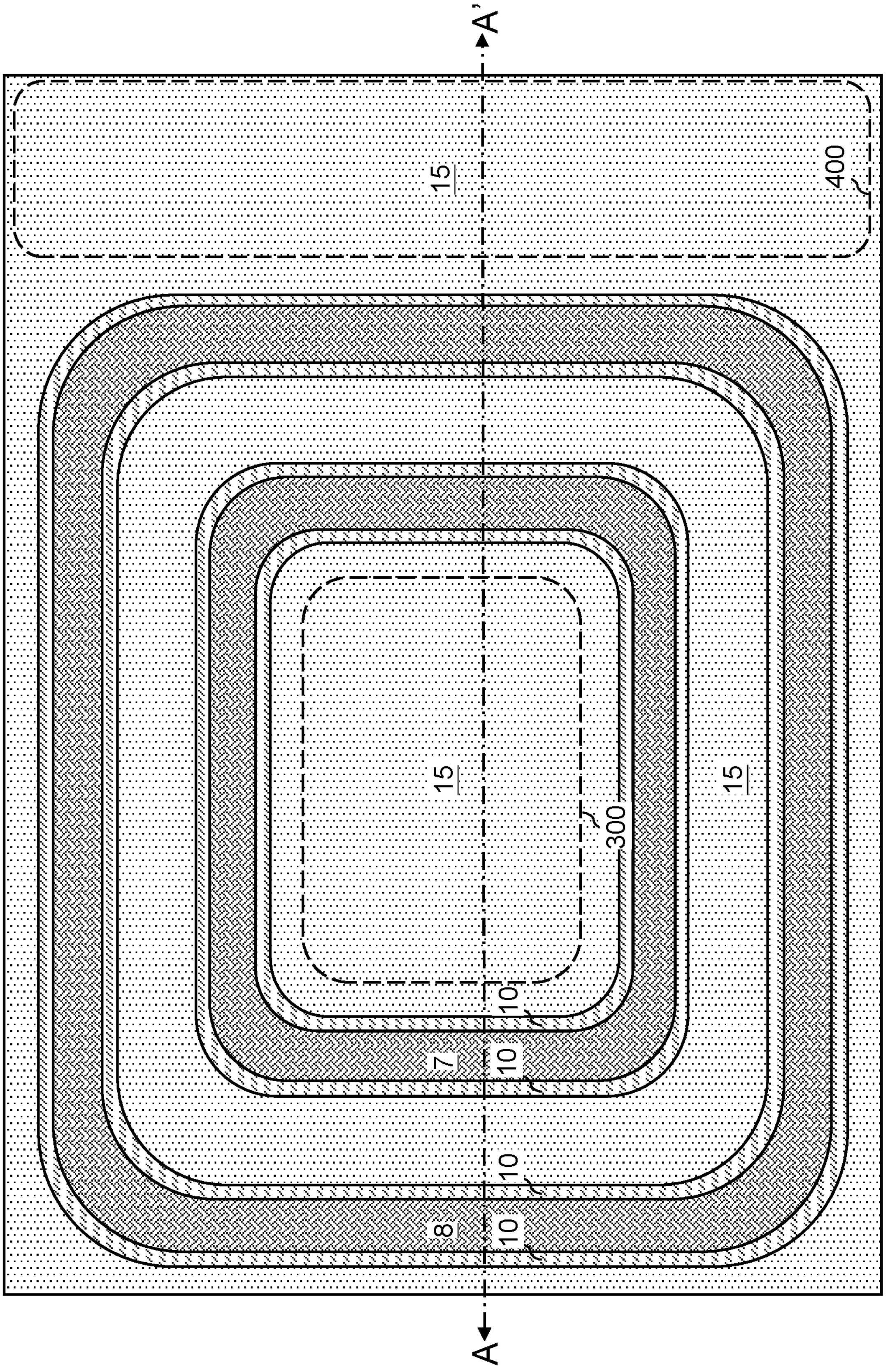
FIG. 2B is a top-down view of the exemplary structure of FIG. 2A. The vertical plane A-A' is the cut plane of FIG. 2A.

Referring to FIGS. 2A and 2B, a second pad dielectric layer 15 may be formed on the top surface of the top semiconductor layer 10. A photoresist layer (not shown) may be applied over the top surface of the second pad dielectric layer 15, and may be lithographically patterned to form at least one moat-shaped opening therethrough. Each of the at least one moat-shaped opening in the photoresist layer may be formed entirely within an annular area defined by an outer periphery and an inner periphery of a respective annular shallow trench fill structure (21, 22). An anisotropic etch process may be performed to transfer the pattern of the at least one moat-shaped opening in the photoresist layer through the second pad dielectric layer 15, the at least one annular shallow trench fill structure (21, 22), the top semiconductor layer 10, and the buried insulating layer 4, and into an upper portion of the handle substrate 2. At least one moat trench (17, 18) may be formed in the volumes from which the materials of the at least one annular shallow trench fill structure (21, 22), the top semiconductor layer 10, the buried insulating layer 4, and the handle substrate 2 are removed.

In one embodiment, each moat trench (17, 18) may be formed through a respective annular shallow trench fill structure (21, 22). In one embodiment, the at least one moat trench (17, 18) may comprise an inner moat trench 17 that is formed through the inner annular shallow trench fill structure 21, and an outer moat trench 18 that is formed through the outer annular shallow trench fill structure 22. Remaining portions of the inner annular shallow trench fill structure 21 may comprise a pair of inner annular shallow trench fill structures 21, and remaining portions of the outer annular shallow trench fill structure 22 may comprise a pair of outer annular shallow trench fill structures 22. A portion of the top semiconductor layer 10 that remains between the inner moat trench 17 and the outer moat trench 18 may comprise a single crystalline semiconductor moat structure 10M, which is a single crystalline semiconductor wall structure that vertically extends from the handle substrate 2 to the top surface of the top semiconductor layer 10. As used herein, a moat structure refers to a continuous structure that laterally surrounds an area and is homeomorphic to a torus, i.e., may be continuously deformed without creating any additional opening therethrough and without destroying any pre-existing opening therethrough into the shape of a torus.

Each of the at least one moat trench (17, 18) laterally surrounds a first portion of the top semiconductor layer 10 that is located in a first device region 300 in a plan view, such as a top-down view. Each of the at least one moat trench (17, 18) may comprise a respective set of straight sidewalls that vertically extend from the top surface of the top semiconductor layer 10 to the handle substrate 2. The width of a top portion of each moat trench (17, 18) may be in a range from 400 nm to 4,000 nm, such as from 600 nm to 3,000 nm, although lesser and greater widths may also be used.

In one embodiment, the handle substrate 2 comprises a semiconductor material (such as single crystalline silicon), and electrical dopants (which may be p-type dopants or n-type dopants) may be implanted into surface portions of the handle substrate 2 that underlie the at least one moat trench (17, 18). In this embodiment, at least one doped well (7, 8) may be formed under the at least one moat trench (17, 18). For example, an inner annular doped well 7 may be formed under the inner moat trench 17, and an outer annular doped well 8 may be formed under the outer moat trench 18. The atomic concentration of electrical dopants in each doped well (7, 8) may be in a range from $1.0\times10^{19}/cm^3$ to $2.0\times10^{21}/cm^3$, although lesser and greater atomic concentrations may also be used. The photoresist layer may be subsequently removed, for example, by ashing.

Figure 3A:
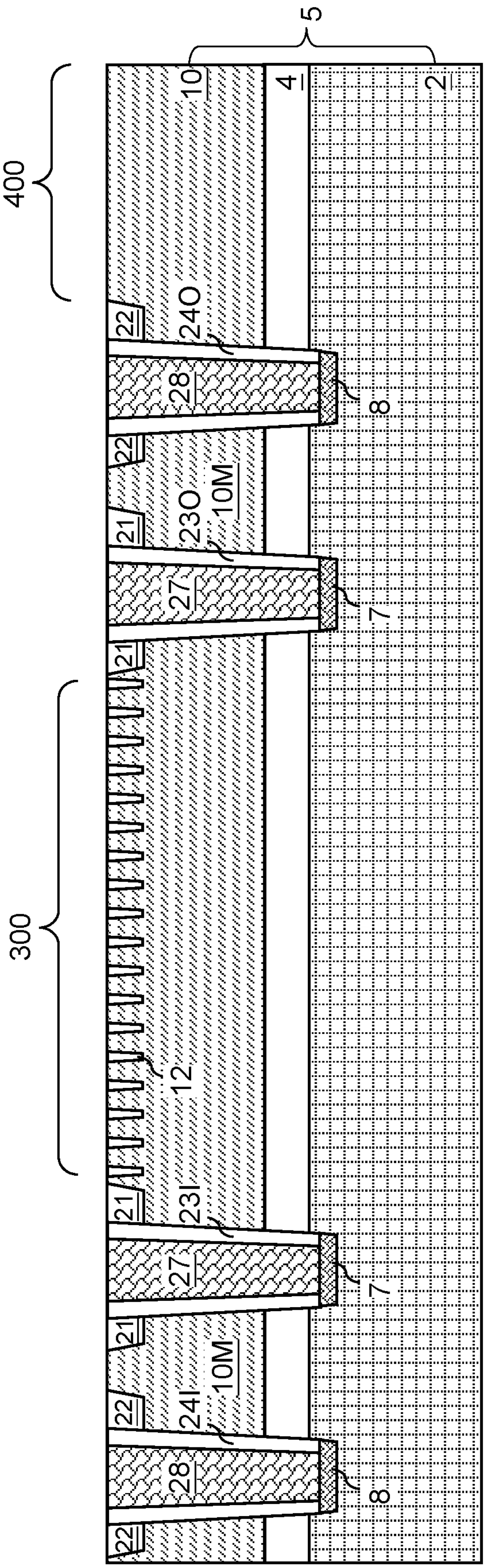
FIG. 3A is a vertical cross-sectional view of the first configuration of the exemplary structure after formation of deep trench isolation structures according to an embodiment of the present disclosure.
Figure 3B:
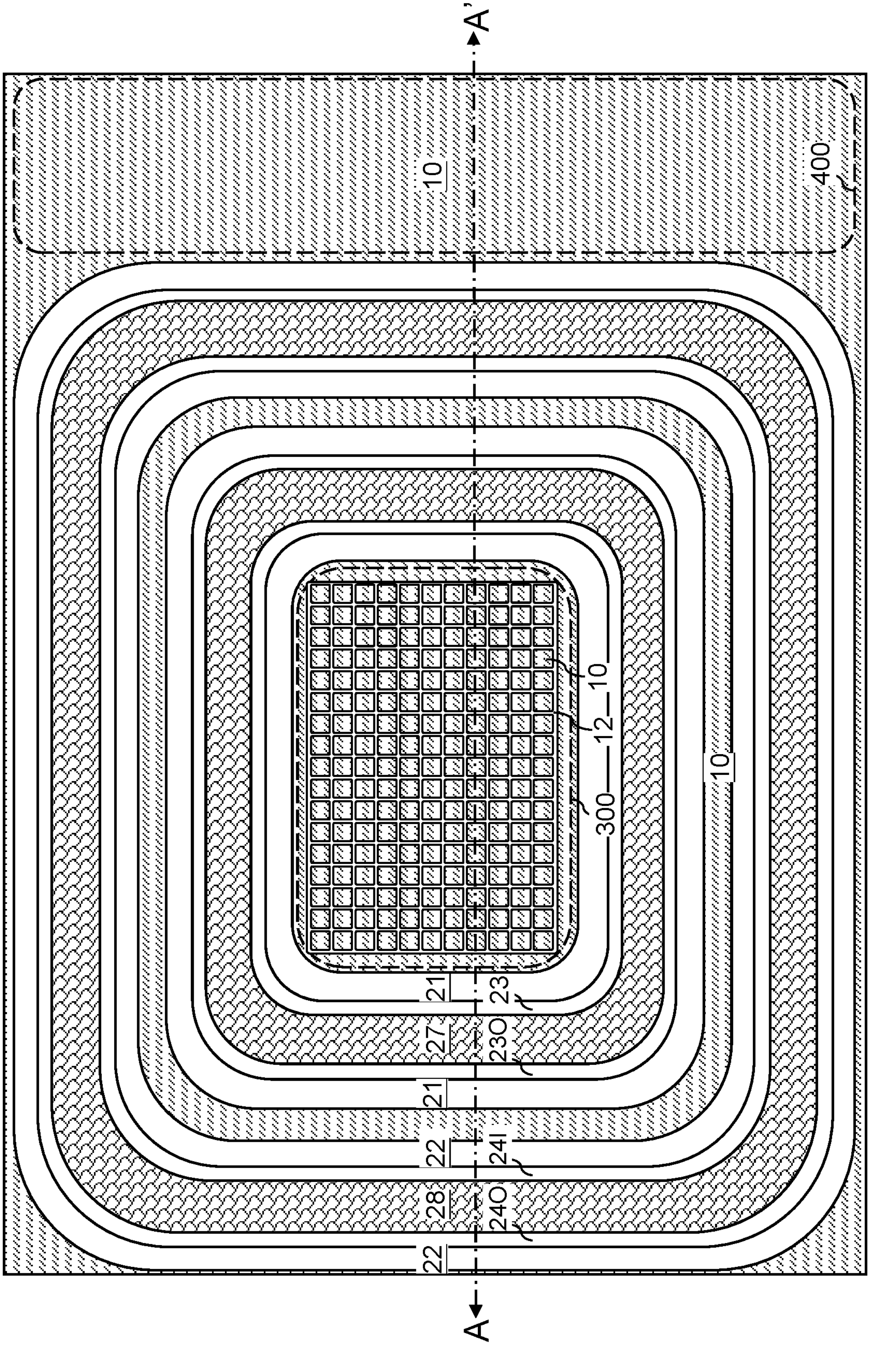
FIG. 3B is a top-down view of the exemplary structure of FIG. 3A. The vertical plane A-A' is the cut plane of FIG. 3A.

Referring to FIGS. 3A and 3B, an insulating liner layer may be conformally deposited in peripheral portions of the at least one moat trench (17, 18) and over the top surface of the second pad dielectric layer 15 (as shown in FIGS. 2A and 2B). The insulating liner layer comprises an insulating material such as silicon oxide. The thickness of the insulating liner layer may be in a range from 30 nm to 300 nm, although lesser and greater thicknesses may also be used. An anisotropic etch process may be performed to remove horizontally-extending portions of the insulating liner layer. Each remaining vertically-extending portion of the insulating liner layer constitutes an insulating liner (23I, 23O, 24I, 24O).

In one embodiment, the insulating liners (23I, 23O, 24I, 24O) may comprise at least one inner insulating liner (23I, 24I) that is formed on inner sidewalls of a respective moat trench (17, 18) and at least one outer insulating liner (23O, 24O) that is formed on outer sidewall of a respective moat trench (17, 18). In one embodiment, the at least one moat trench (17, 18) comprises an inner moat trench 17 and an outer moat trench 18, and the insulating liners (23I, 23O, 24I, 24O) may comprise a first inner insulating liner 23I that is formed on inner sidewalls of the inner moat trench 17, a first outer insulating liner 23O that is formed on outer sidewalls of the inner moat trench 17, a second inner insulating liner 24O that is formed on inner sidewalls of the outer moat trench 18, and a second outer insulating liner 24I that is formed on outer sidewalls of the outer moat trench 18. As discussed above, ordinals are not a part of a noun that refers to the insulating liners (23I, 23O, 24I, 24O), and thus, the various insulating liners (23I, 23O, 24I, 24O) may individually be referred to with a different set of ordinals when multiple insulating liners (23I, 23O, 24I, 24O) are referred to.

A non-insulating material may be deposited in remaining volume of the at least one moat trench (17, 18) and over the second pad dielectric layer 15. The non-insulating material may comprise a conductive material or a semiconducting material. As used herein, a "conductive material" refers to a material having electrical conductivity greater than $1.0\times10^5$ S/m. As used herein, an "insulator material" or a "dielectric material" refers to a material having electrical conductivity less than $1.0\times10^{-5}$ S/m. A semiconducting material refers to a material having electrical conductivity in a range from $1.0\times10^{-5}$ S/m to $1.0\times10^5$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^7$ S/m upon suitable doping with an electrical dopant. Thus, a semiconductor material is semiconducting or conductive depending on the atomic concentration and electrical activation of electrical dopants therein. If a semiconductor material is conductive, such as semiconductor material is referred to as a heavily-doped semiconductor material.

The non-insulating material that is deposited in remaining volume of the at least one moat trench (17, 18) and over the second pad dielectric layer 15 may comprise a semiconductor material such as polysilicon or amorphous silicon, and/or may comprise at least one metallic material such as a combination of a metallic barrier liner material (e.g. TiN, TaN, WN, and/or MoN) and a metallic fill material (such as a refractory metal). In one embodiment, the non-insulating material may comprise heavily doped polysilicon that may be subsequently annealed to activate electrical dopants to provide electrical conductivity greater than $1.0\times10^5$ S/m.

A planarization process such as a chemical mechanical polishing process may be performed to remove portions of the non-insulating material from above the horizontal plane including the top surface of the second pad dielectric layer 15. Further, a recess etch process may be subsequently performed to vertically recess remaining portions of the non-insulating material from above the horizontal plane including the top surface of the top semiconductor layer 10. Each remaining portion of the non-insulating material that fills a portion of a respective moat trench (17, 18) constitutes a non-insulating moat structure (27, 28), which may be a conductive structure or a semiconducting structure. The second pad dielectric layer 15 may be removed selective to the materials of the top semiconductor layer 10 and the shallow trench isolation structures (21, 22, 12) by performing a selective etch process. For example, in instances in which the second pad dielectric layer 15 comprises silicon nitride, a wet etch process using hot phosphoric acid may be used to remove the second pad dielectric layer 15.

In one embodiment, the non-insulating moat structure (27, 28) may comprise an inner non-insulating moat structure 27 that is formed within an inner moat trench 17, and an outer non-insulating moat structure 28 that is formed within an outer moat trench 18. Each contiguous combination of structural elements that fills a respective moat trench (17, 18) constitutes a deep trench isolation structure {(27, 23I, 23O) or (28, 24I, 24O)}. In one embodiment, the at least one deep trench isolation structure {(27, 23I, 23O), (28, 24I, 24O)} may comprise an inner deep trench isolation structure (27, 23I, 23O) that is formed in an inner moat trench 17, and an outer deep trench isolation structure (28, 24I, 24O) that is formed in an outer moat trench 18. One of the deep trench isolation structures {(27, 23I, 23O), (28, 24I, 24O)} may be referred to as a first deep trench isolation structures {(27, 23I, 23O) or (28, 24I, 24O)}, and another of the deep trench isolation structures {(27, 23I, 23O), (28, 24I, 24O)} may be referred to as a second deep trench isolation structures {(27, 23I, 23O) or (28, 24I, 24O)}.

Generally, at least one deep trench isolation structure {(27, 23I, 23O) or (28, 24I, 24O)} may be formed in the at least one moat trench (17, 18). A first deep trench isolation structure {(27, 23I, 23O) or (28, 24I, 24O)} vertically extends through the top semiconductor layer 10 and the buried insulating layer 4, and comprises a first inner insulating liner (23I or 24I) laterally surrounding a first portion of the top semiconductor layer 10 that is located in the first device region 300 in a plan view; a first non-insulating moat structure (27 or 28) laterally surrounding the first inner insulating liner (23I or 24I), and a first outer insulating liner (23O or 24O) that laterally surrounds the first non-insulating moat structure (27 or 28). In one embodiment, a first deep trench isolation structure {(27, 23I, 23O) or (28, 24I, 24O)} comprises a first non-insulating moat structure (27 or 28) laterally surrounding a first portion of the top semiconductor layer 10 that is located in a first device region 300 in a plan view; and a second deep trench isolation structure {(27, 23I, 23O) or (28, 24I, 24O)} comprises a second non-insulating moat structure (27 or 28) laterally surrounding, or is laterally surrounded by, the first deep trench isolation structure {(27, 23I, 23O) or (28, 24I, 24O)} in the plan view.

According to an aspect of the present disclosure, each non-insulating moat structure (27 or 28) in the at least one deep trench isolation structure {(27, 23I, 23O) or (28, 24I, 24O)} functions as signal shielding structures for external electromagnetic signals. Preferably, each non-insulating moat structure (27 or 28) is conductive, and provides effective signal shielding through high electrical conductivity. According to an aspect of the present disclosure, the at least one deep trench isolation structure {(27, 23I, 23O) or (28, 24I, 24O)} comprise a plurality of deep trench isolation structures {(27, 23I, 23O), (28, 24I, 24O)} to provide sufficient electrical isolation for memory devices to be subsequently formed in the first device region 300.

Figure 4A:
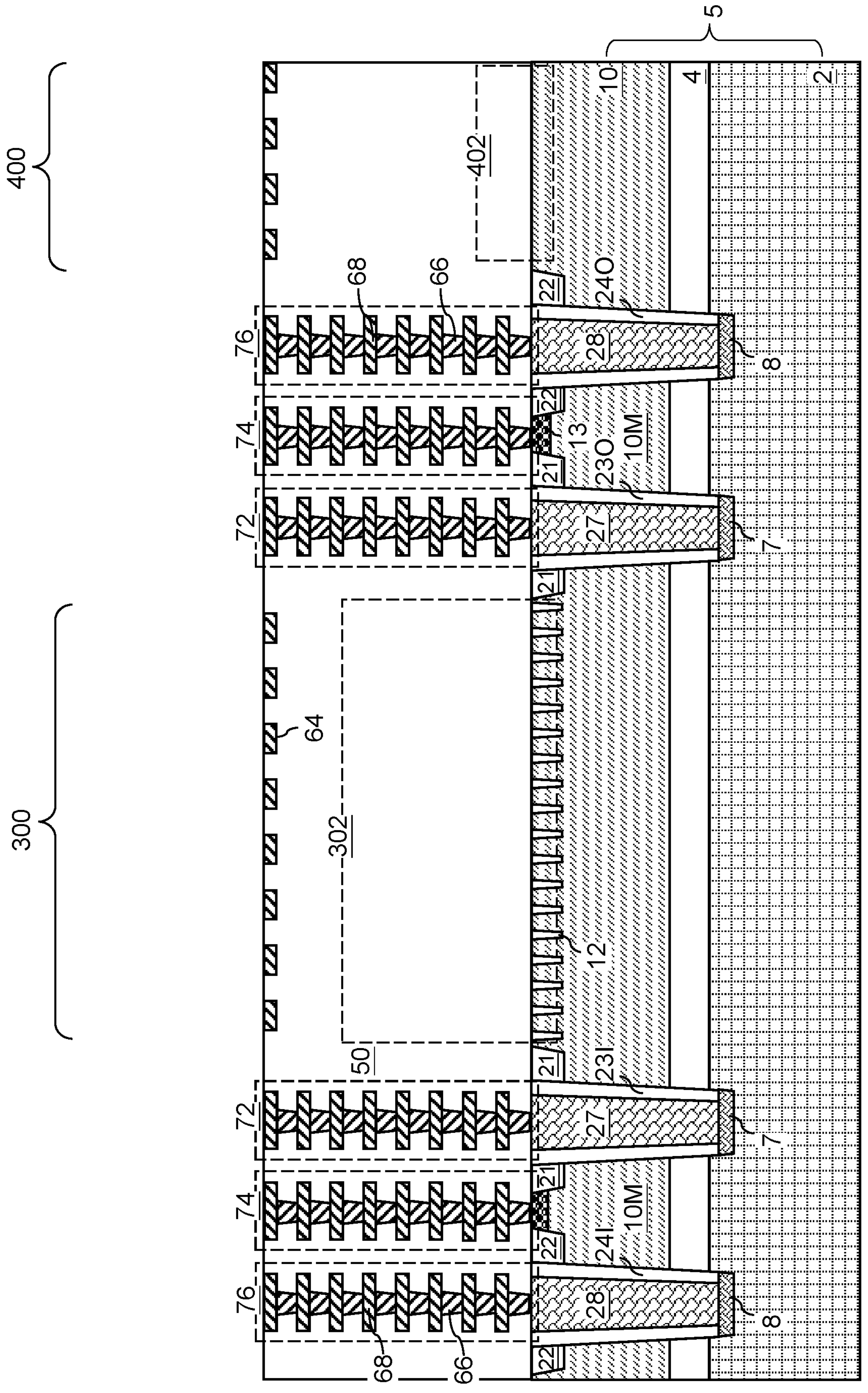
FIG. 4A is a vertical cross-sectional view of the first configuration of the exemplary structure after formation of a memory array, peripheral devices, lower-level dielectric material layers, lower-level metal interconnect structures, and metallic moat structures according to an embodiment of the present disclosure.
Figure 4B:
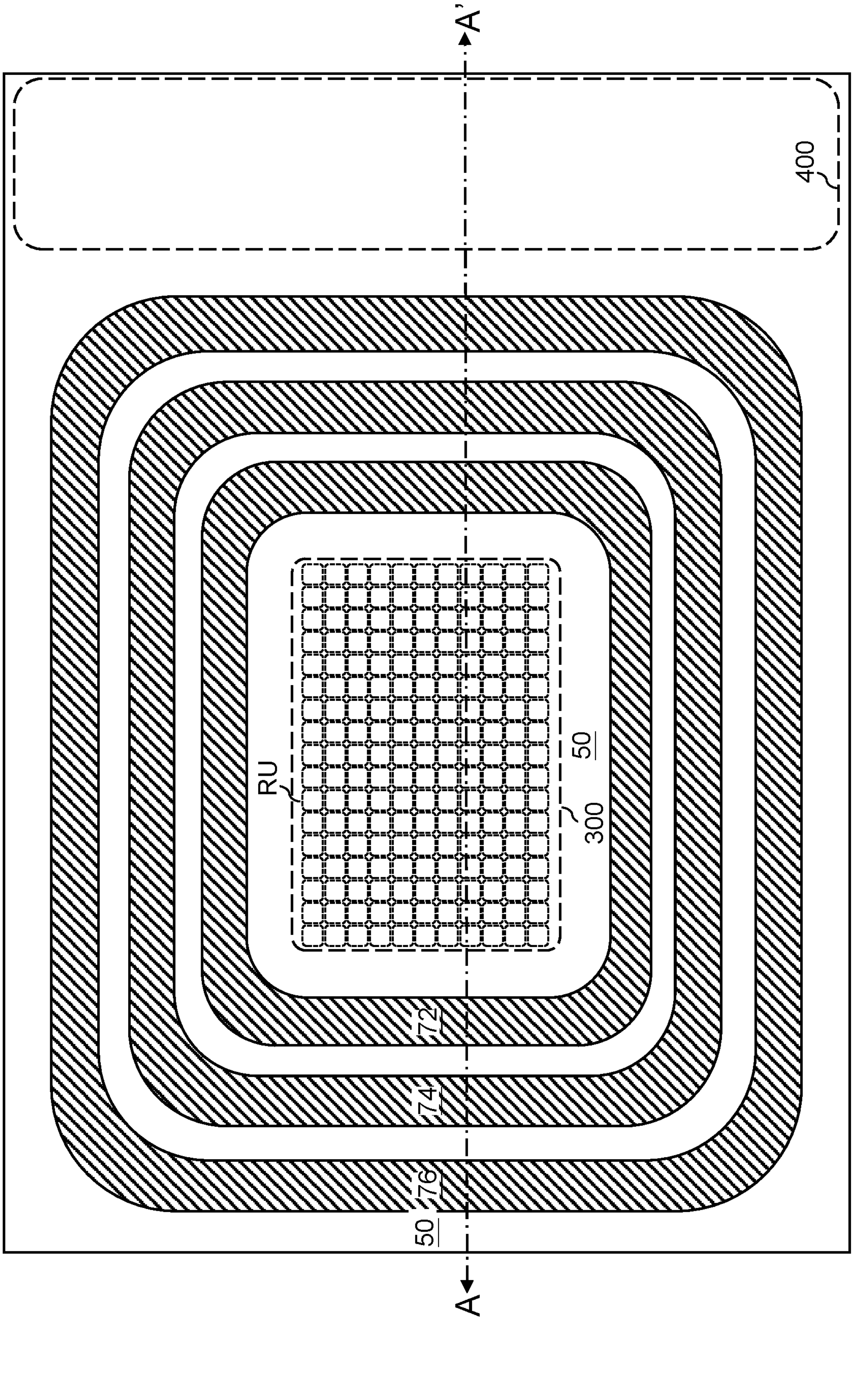
FIG. 4B is a top-down view of the exemplary structure of FIG. 4A. The vertical plane A-A' is the cut plane of FIG. 4A.
Figure 4C:
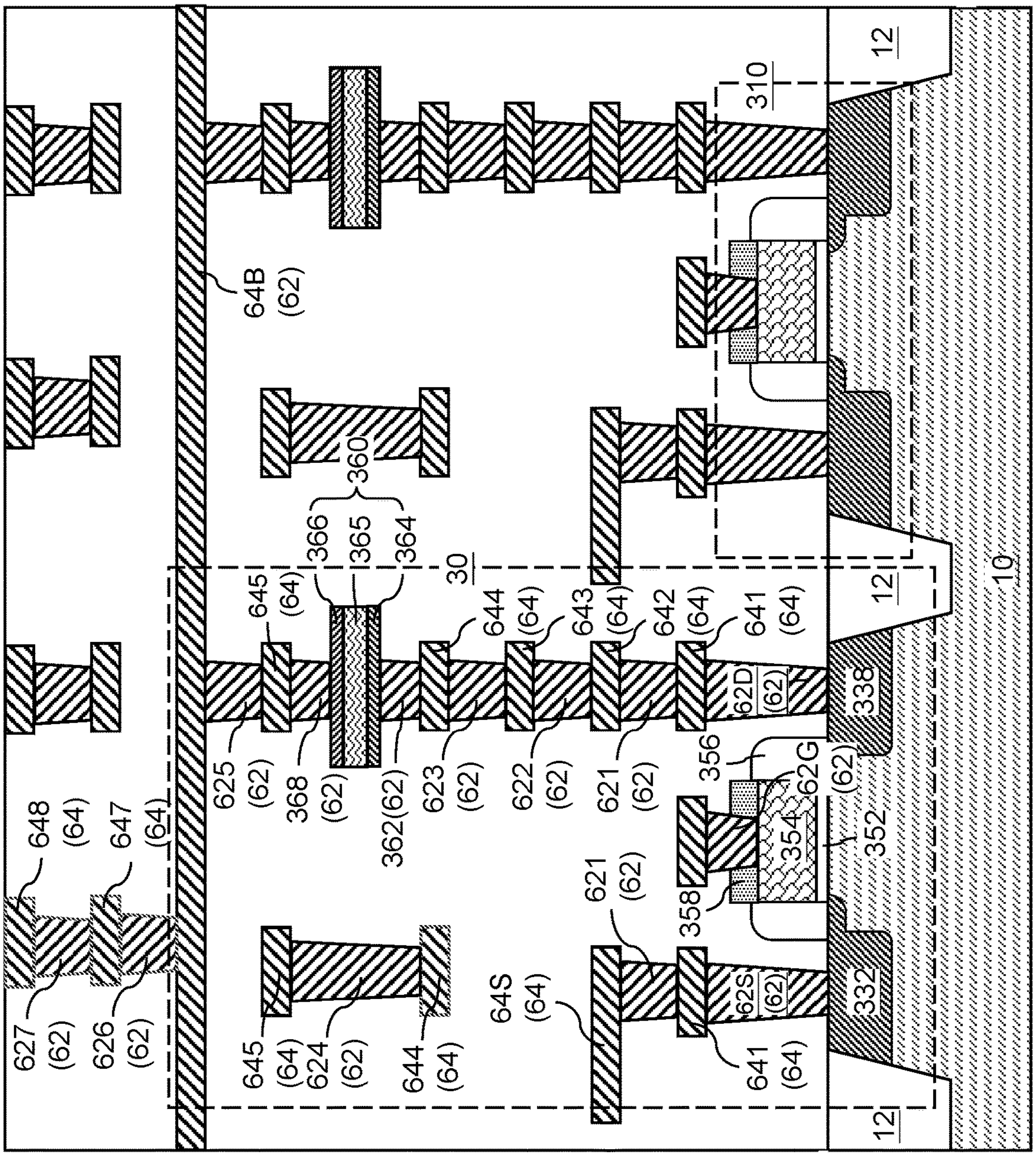
FIG. 4C is a magnified vertical cross-sectional view of a portion of a memory array region in FIG. 4A.

Referring to FIGS. 4A-4C, semiconductor devices, lower-level dielectric material layers 50, lower-level metal interconnect structures (62, 64), and metallic moat structures (72, 74, 76) may be formed over the top semiconductor layer 10. In one embodiment, the semiconductor devices may comprise a resistive memory array 302 that is formed on the first portion of the top semiconductor layer 10 and entirely within the first device region 300 in a plan view. Further, the semiconductor devices may comprise peripheral devices 402 that are formed in the second device region 400.

In one embodiment, the resistive memory array 302 may comprise a two-dimensional array of resistive memory devices 30. Each resistive memory device 30 may be a unit of repetition that is repeated along two different horizontal directions. In one embodiment, the shallow trench isolation grid 12 may comprise an M×N rectangular grid of openings therein. Each of M and N may be an integer greater than 1. For example, each of M and N may be independently in a range from 2 to 216. The resistive memory array 302 may comprise an M×N rectangular array of resistive memory devices 30. Each resistive memory device 30 may be a repetition unit RU within the resistive memory array 302.

In one embodiment, each resistive memory device 30 may comprise an access transistor 310 and a resistive memory cell 360. The access transistor 310 may comprise a source region 332, a drain region 338, a gate stack including a gate dielectric 352, a gate electrode 354, a gate cap dielectric 358, and a dielectric gate spacer 356. The source region 332 may comprise a combination of a source extension region and a deep source region. The drain region 338 may comprise a combination of a drain extension region and a deep drain region. Each resistive memory cell 360 comprises a first electrode 364 (which may be a bottom electrode), a resistive memory element 365 comprising a material that provides at least two different resistive states, and a second electrode 366 (which may be a top electrode). The first electrode 364 may comprise a first inert metallic material such as TiN, TaN, WN, and/or MoN. The second electrode 366 may comprise a second inert metallic material such as TiN, TaN, WN, and/or MoN.

The material of each resistive memory element 365 that provides at least two different resistive states is herein referred to as a resistive memory material. Generally, the resistive memory material may be any type of resistive memory material known in the art. In one embodiment, the resistive memory material may comprise a filament-forming metal oxide material which provides a higher conductivity upon formation of conductive filaments therein (such as hafnium oxide, titanium oxide, niobium pentoxide, germanium telluride, silver sulfate, zinc oxide, vanadium oxide, tantalum oxide, zirconium oxide, etc.). In one embodiment, the resistive memory material may comprise a phase change memory material containing a chalcogenide glass (such as an alloy of germanium, antimony, and tellurium, and optionally additional additives). In one embodiment, the resistive memory material may comprise a conductive bridge-forming material in which conductive bridges may be formed or ruptured (such as silver, copper, silver sulfide, mixed ionic-electronic conductor materials (e.g., yttria-stabilized zirconia), etc.). In one embodiment, the resistive memory material may comprise an organic polymer material that may provide at least two different resistive states. In one embodiment, the resistive memory material may comprise a perovskite-based material that may provide at least two different resistive states. In one embodiment, the resistive memory material may comprise a two-dimensional material such as molybdenum disulfide ($MoS_2$) that may provide at least two different resistive states. In one embodiment, the resistive memory material may comprise an organic-inorganic hybrid resistive memory material that may provide at least two different resistive states. In one embodiment, the resistive memory material may comprise a rare earth oxide resistive memory material that may provide at least two different resistive states.

The peripheral devices 402 may comprise various types of semiconductor devices, and may include field effect transistors, diodes, resistors, capacitors, inductors, etc. The peripheral devices 402 may comprise word line drivers, bit line drivers, and sense amplifiers for the resistive memory array 302. Further, the peripheral devices 402 may comprise input/output drivers, data buffers, and additional circuit components for supporting operation of the resistive memory array 302.

Various metal interconnect structures may be formed within dielectric material layers. The various metal interconnect structures are herein referred to as lower-level metal interconnect structures (62, 64), and the dielectric material layers are herein referred to as lower-level dielectric material layers 50. The lower-level metal interconnect structures (62, 64) comprise metallic via structures 62 and metallic line structures 64.

For example, the metallic via structures 62 may comprise source contact via structures 62S, drain contact via structures 62D, gate contact via structures 62G, first-via-level via structures 621, second-via-level via structures 622, third-via-level via structures 623, fourth-via-level via structures 624, fifth-via-level via structures 625, sixth-via-level via structures 626, seventh-via-level via structures 627, etc. Further, the metallic via structures 62 may comprise bottom-electrode-contact via structures 362 contacting bottom surfaces of the first electrodes 364 (which are bottom electrodes), and top-electrode-contact via structures 368 contacting top surfaces of the second electrodes 366 (which are top electrodes).

The metallic line structures 64 may comprise first-line-level metal lines 641, second-line-level metal lines 642, third-line-level metal lines 643, fourth-line-level metal lines 644, fifth-line-level metal lines 645, sixth-line-level metal lines which may comprise bit lines 64B, seventh-line-level metal lines 647, eighth-line-level metal lines 648, etc. A subset of the metallic line structures 64 may comprise source lines 64S, which may comprise a subset of the second-line-level metal lines 642 in the illustrated example. The lower-level metal interconnect structures (62, 64) provide functional electrical connections to and from the various components of the resistive memory array 302 and to and from the various components of the peripheral devices 402.

The peripheral devices 402 as connected by the lower-level metal interconnect structures (62, 64) constitute a peripheral circuit, which is configured to operate the resistive memory array 302.

In summary, an array of access transistors 310 may be formed such that active regions of the array of access transistors 310 are formed within the first portion of the top semiconductor layer 10. A shallow trench isolation grid 12 may be formed within an upper region of the first portion of the top semiconductor layer 10, and may laterally surround active regions of the access transistors 310 of the resistive memory array 302. Each access transistor 310 may comprise a drain region 338 that is electrically connected to the first electrode 364 of a respective resistive memory cell 360 within each resistive memory device 30. Peripheral devices 402 may be formed in the second device region 400. The peripheral devices 402 may be configured to control operation of the resistive memory devices 30 in the resistive memory array 302. The second device region 400 may be located entirely outside the first device region 300 and outside an outer periphery of a first deep trench isolation structure {(27, 23I, 23O) or (28, 24I, 24O)}. First metal interconnect structures (which is a first subset of the lower-level metal interconnect structures (62, 64)) formed within first dielectric material layers (such as the lower-level dielectric material layers 50) may be formed over the array of access transistors 310 such that the first metal interconnect structures are electrically connected to the array of access transistors 310.

According to an aspect of the present disclosure, at lest one metallic moat structure (72, 74, 76) may be formed in the lower-level dielectric material layers 50. Each metallic moat structure (72, 74, 76) vertically extends from a horizontal plane including the top surface of the top semiconductor layer 10 to the topmost surface of the lower-level dielectric material layers 50. Generally, the topmost surface of the lower-level dielectric material layers 50 is located above the horizontal plane including topmost surfaces of resistive memory cells 360. Therefore, each metallic moat structure (72, 74, or 76) vertically extends from a top surface of the SOI substrate 5 at least to a horizontal plane that overlies topmost surfaces of resistive memory cells 360 within the resistive memory array 302.

Each metallic moat structure (72, 74, 76) may comprise a vertically alternating sequence of via-level metallic wall structures 66 and line-level metallic wall structures 68. Each via-level metallic wall structure 66 may be formed at the same level as a respective subset of the metallic via structures 62, and thus, is equidistant from the horizontal plane including the top surface of the top semiconductor layer 10 as the respective subset of the metallic via structures 62. Each line-level metallic wall structure 68 may be formed at the same level as a respective subset of the metallic line structures 64, and thus, is equidistant from the horizontal plane including the top surface of the top semiconductor layer 10 as the respective subset of the metallic line structures 64. Each of the via-level metallic wall structures 66 and the line-level metallic wall structures 68 may have a respective tubular configuration such that the entirety of the via-level metallic wall structures 66 and the line-level metallic wall structures 68 is formed outside the area of the first device region 300 in a plan view. Further, each of the via-level metallic wall structures 66 and the line-level metallic wall structures 68 may be free of any lateral opening therethrough. Thus, each of the via-level metallic wall structures 66 and the line-level metallic wall structures 68 may be topologically homeomorphic to a torus.

In one embodiment, the at least one metallic moat structure (72, 74, 76) may comprise a plurality of metallic moat structures (72, 74, 76). For example, the at least one metallic moat structure (72, 74, 76) may comprise an inner metallic moat structure 72 that is formed on a top surface of the inner non-insulating moat structure 27, an intermediate metallic moat structure 74 that is formed on a top surface of the single crystalline semiconductor moat structure 10M, and an outer metallic moat structure 76 that is formed on a top surface of the outer non-insulating moat structure 28. In one embodiment, the entirety of the bottom surface of the inner metallic moat structure 72 may be in contact with the top surface of the inner non-insulating moat structure 27. In one embodiment, the entirety of the bottom surface of the outer metallic moat structure 76 may be in contact with the top surface of the outer non-insulating moat structure 28. In one embodiment, a top surface portion of the single crystalline semiconductor moat structure 10M may be converted into a heavily doped single crystalline semiconductor well 13 providing electrical conductivity greater than $1.0\times10^5$ S/m. In this embodiment, a bottom surface of the intermediate metallic moat structure 74 may contact a top surface of the heavily doped single crystalline semiconductor well 13, which is a portion of the top semiconductor layer 10.

According to an aspect of the present disclosure, the at least one metallic moat structure (72, 74, 76) functions as signal shielding structures for external electromagnetic signals at the level of the lower-level metal interconnect structures (62, 64). According to an aspect of the present disclosure, the at least one metallic moat structure (72, 74, 76) comprise a plurality of metallic moat structures (72, 74, 76) to provide enhanced electrical isolation for the resistive memory array 302 that is located in the first device region 300.

Generally, a first metallic moat structure (72, 74, or 76) laterally surrounding the resistive memory array 302 is formed. Peripheral devices 402 may be formed in a second device region 400 that is located entirely outside the first device region 300 and outside an outermost periphery of the at least one deep trench isolation structure {(27, 23I, 23O) or (28, 24I, 24O)}. The peripheral devices 402 are configured to control operation of the resistive memory devices 30 in the resistive memory array 302.

An array of access transistors 310 may be formed in the first device region 300. Lower-level metal interconnect structures (62, 64) embedded in lower-level dielectric material layers 50 may be formed. Resistive memory cells 360 may be formed on a first subset of the lower-level metal interconnect structures (62, 64), which is formed within the first device region 300 below the horizontal plane including the bottom surfaces of the resistive memory cells 360. In one embodiment, each of the resistive memory cells 360 comprises a first electrode 364, a resistive memory element 365 comprising a material that provides at least two different resistive states; and a second electrode 366. Each access transistor 310 comprises a drain region 338 that is electrically connected to the first electrode 364 of the resistive memory cell 360 through a respective subset of the lower-level metal interconnect structures (62, 64). A resistive memory array 302 may be formed on a first portion of the top semiconductor layer 10 that is located entirely within the first device region 300 in the plan view.

The lower-level metal interconnect structures (62, 64) comprise source lines 64S and bit lines 64B that are formed entirely within the first device region 300 in a plan view. The source lines 64S may be electrically connected to source regions 332 of a respective subset of the access transistors 310 within the resistive memory array 302, and may be located entirely within the first device region 300 in the plan view. The bit lines 64B may be electrically connected to second electrodes 366 of a respective column of the second electrodes 366 within the resistive memory array 302, and may be located entirely within the first device region 300 in the plan view.

A first metallic moat structure (72, 74, or 76) may laterally surround the resistive memory array 302, and may vertically extend from a top surface of the SOI substrate 5 to a horizontal plane that overlies topmost surfaces of the resistive memory cells 360 within the resistive memory array 302. In one embodiment, the first metallic moat structure (72, 74, or 76) comprises a vertically alternating sequence of via-level metallic wall structures 66 and line-level metallic wall structures 68. The top surface of the first metallic moat structure (72, 74, or 76) may be formed in a horizontal plane including a topmost surface of the lower-level dielectric material layers 50.

In one embodiment, the first metallic moat structure may comprise an inner metallic moat structure 72 or an outer metallic moat structure 76. In this embodiment, the entirety of a bottom surface of the first metallic moat structure (72 or 76) may be in contact with a top surface of the first non-insulating moat structure (27 or 28). In one embodiment, the first metallic moat structure may comprise an intermediate metallic moat structure 74 or an outer metallic moat structure 76. In this embodiment, the entirety of a bottom surface of the first metallic moat structure (comprising the outer metallic moat structure 76) may be in contact with a top surface of a portion (which may, or may not, comprise a heavily doped single crystalline semiconductor well 13) of the top semiconductor layer 10 that is located outside the first deep trench isolation structure {(27, 23I, 23O) or (28, 24I, 24O)}.

In on embodiment, the first deep trench isolation structure may comprise an outer deep trench isolation structure (28, 24I, 24O), and the first metallic moat structure may comprise the intermediate metallic moat structure 74. In this embodiment, the entirety of a bottom surface of the first metallic moat structure (comprising the intermediate metallic moat structure 74) is in contact with a top surface of a portion of the top semiconductor layer 10 that is located inside the first deep trench isolation structure (comprising an outer deep trench isolation structure (28, 24I, 24O)). In on embodiment, the first deep trench isolation structure may comprise an inner deep trench isolation structure (27, 23I, 23O), and the first metallic moat structure may comprise the intermediate metallic moat structure 74. In this embodiment, the entirety of a bottom surface of the first metallic moat structure (comprising the intermediate metallic moat structure 74) is in contact with a top surface of a portion of the top semiconductor layer 10 that is located outside the first deep trench isolation structure (comprising an inner deep trench isolation structure (27, 23I, 23O)).

In one embodiment, the at least one deep trench isolation structure {(27, 23I, 23O) or (28, 24I, 24O)} may comprise a plurality of deep trench isolation structures {(27, 23I, 23O), (28, 24I, 24O)}. For example, the plurality of deep trench isolation structures {(27, 23I, 23O), (28, 24I, 24O)} may comprise a first deep trench isolation structure (such as an inner deep trench isolation structure (27, 23I, 23O)) comprising a first non-insulating moat structure (such as an inner non-insulating moat structure 27) laterally surrounding a first portion of the top semiconductor layer 10 that is located in a first device region 300 in a plan view, and may further comprise a second deep trench isolation structure (such as an outer deep trench isolation structure (28, 24I, 24O)) comprising a second non-insulating moat structure (such as an outer non-insulating moat structure 28) laterally surrounding the first deep trench isolation structure (comprising the inner deep trench isolation structure (27, 23I, 23O)) in the plan view.

Generally, a first metallic moat structure (72, 74, or 76) laterally surrounds the resistive memory array 302 and vertically extending from the top surface of the SOI substrate 5 at least to the horizontal plane including topmost surfaces of the resistive memory cells 360. In one embodiment, a second metallic moat structure (72, 74, or 76) laterally surrounds the resistive memory array 302 and vertically extends from the top surface of the SOI substrate 5 at least to the horizontal plane. The second metallic moat structure (72, 74, or 76) laterally surrounds, or is laterally surrounded by, the first metallic moat structure (72, 74, or 76). In one embodiment, a third metallic moat structure (72, 74, or 76) laterally surrounds the resistive memory array 302 and vertically extends from the top surface of the SOI substrate 5 at least to the horizontal plane. The third metallic moat structure (72, 74, or 76) laterally surrounds, or is laterally surrounded by, the first metallic moat structure (72, 74, or 76), and laterally surrounds, or is laterally surrounded by, the second metallic moat structure (72, 74, or 76).

In embodiments in which a plurality of deep trench isolation structures {(27, 23I, 23O), (28, 24I, 24O)} is provided, a metallic moat structure (72, 74, or 76) may contact a top surface of a deep trench isolation structure {(27, 23I, 23O) or (28, 24I, 24O)} that is selected from the first deep trench isolation structure {(27, 23I, 23O) or (28, 24I, 24O)} and the second deep trench isolation structure {(27, 23I, 23O) or (28, 24I, 24O)}. Alternatively, an entirety of a bottom surface of a metallic moat structure (72, 74, or 76) may be in contact with a top surface of a portion of the top semiconductor layer 10.

Figure 5:
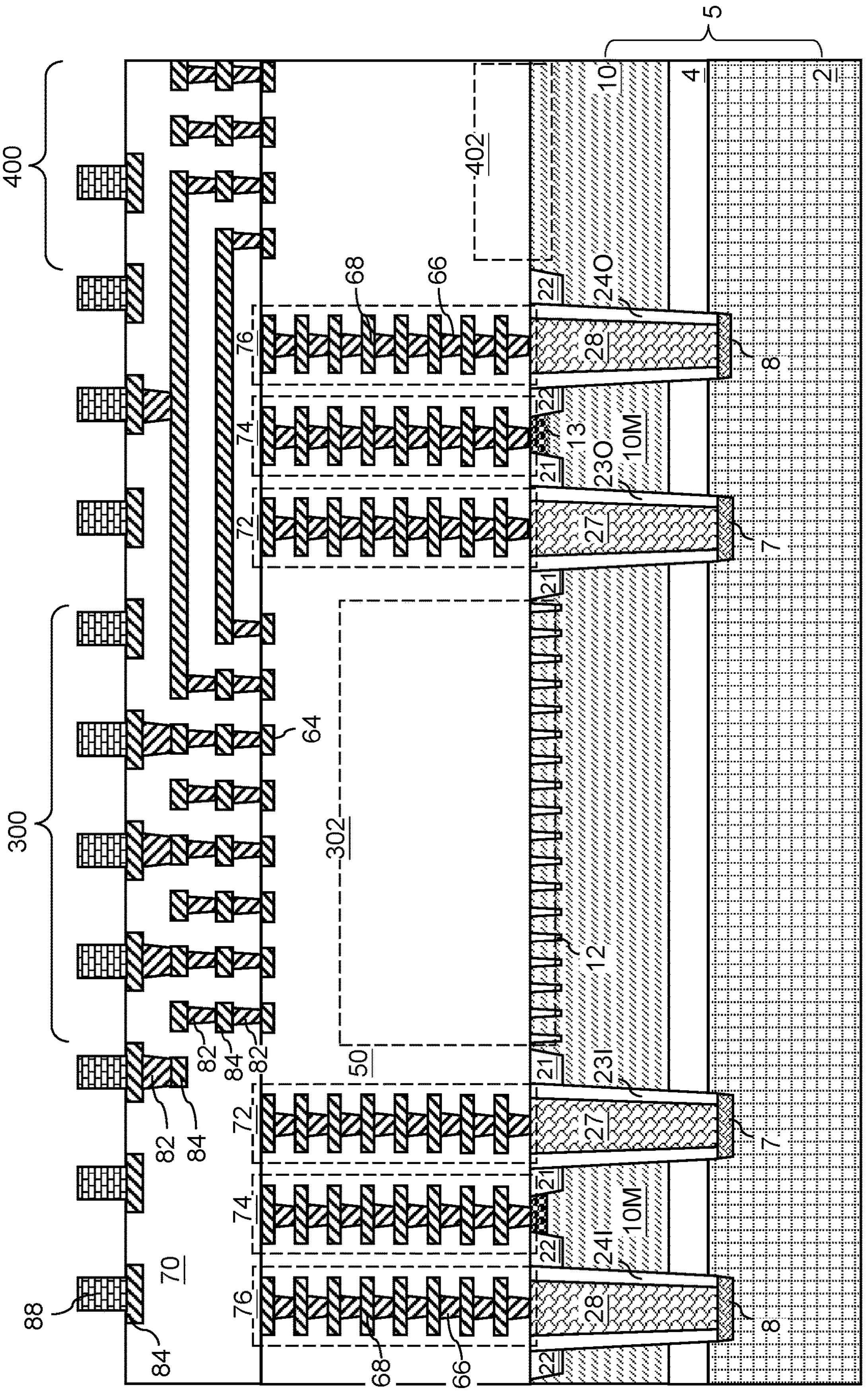
FIG. 5 is a vertical cross-sectional view of the first configuration of the exemplary structure after formation of upper-level dielectric material layers, upper-level metal interconnect structures, and metallic bump structures according to an embodiment of the present disclosure.

Referring to FIG. 5, additional metal interconnect structures and additional dielectric material layers may be formed. The additional metal interconnect structures are referred to as upper-level metal interconnect structures (82, 84), and the additional dielectric material layers are referred to as upper-level dielectric material layers 70. The upper-level metal interconnect structures (82, 84) may comprise metallic via structures 82 and metallic line structures 84.

According to an aspect of the present disclosure, a subset of the upper-level metal interconnect structures (82, 84) laterally extends over the first metallic moat structure (72, 74, or 76) and provides electrically conductive paths between the peripheral devices 402 in the second device region 400 and the resistive memory array 302 in the first device region 300. Thus, the lateral electrical connections between the peripheral devices 402 and the resistive memory array 302 may be formed above the horizontal plane including the topmost surfaces of the metallic moat structures (72, 74, 76).

Subsequently, metallic bump structures 88 may be formed over the upper-level metal interconnect structures (82, 84). The metallic bump structures 88 may comprise microbump structures or controlled collapse chip connection (C4) bonding pads.

Figure 6:
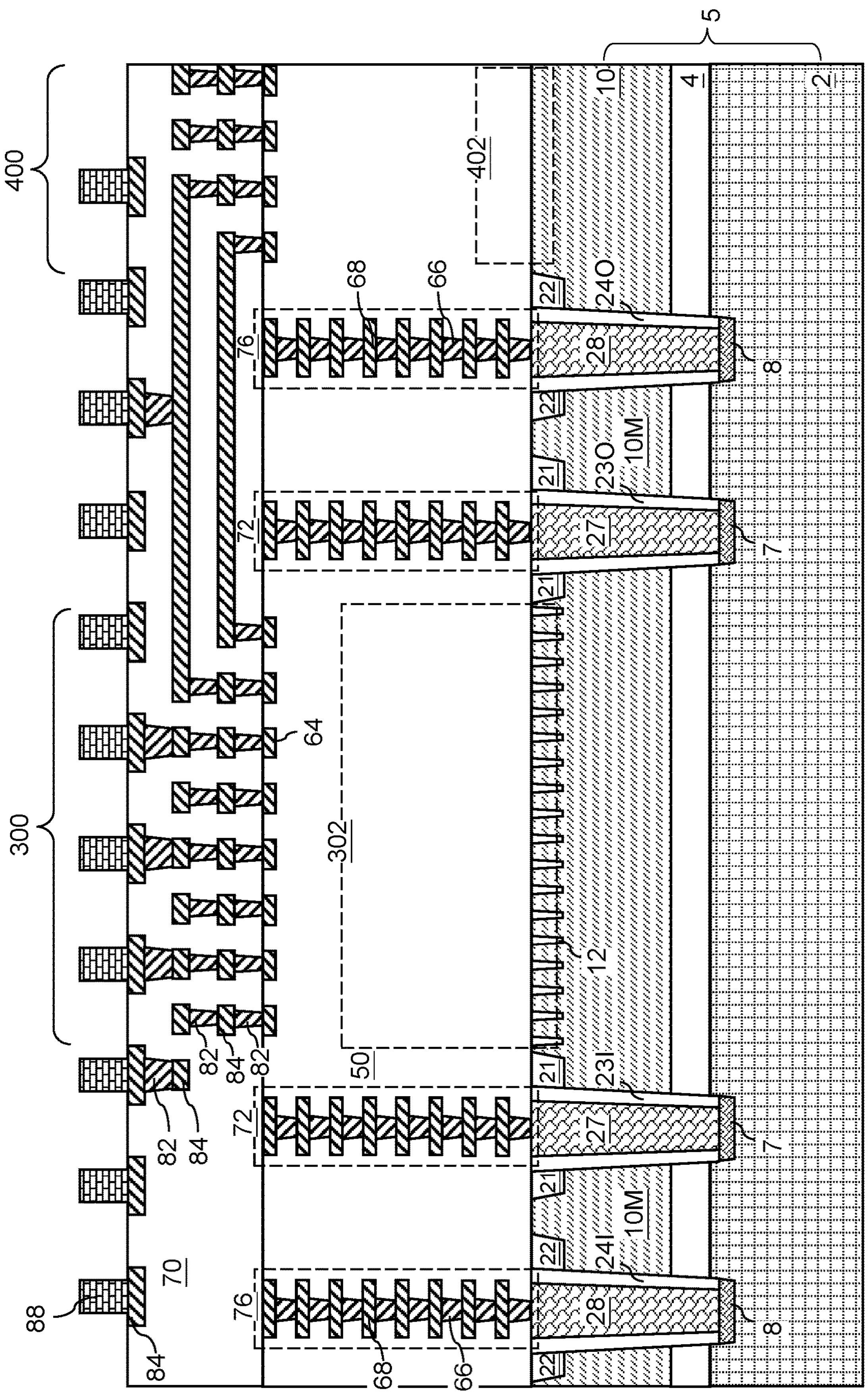
FIG. 6 is a vertical cross-sectional view of a second configuration of the exemplary structure according to an embodiment of the present disclosure.

Referring to FIG. 6, a second configuration of the exemplary structure according to an embodiment of the present disclosure may be derived from the first configuration of the exemplary structure illustrated in FIG. 5 by omitting formation of the intermediate metallic moat structure 74. In this embodiment, formation of the heavily doped single crystalline semiconductor well 13 may be omitted.

Figure 7:
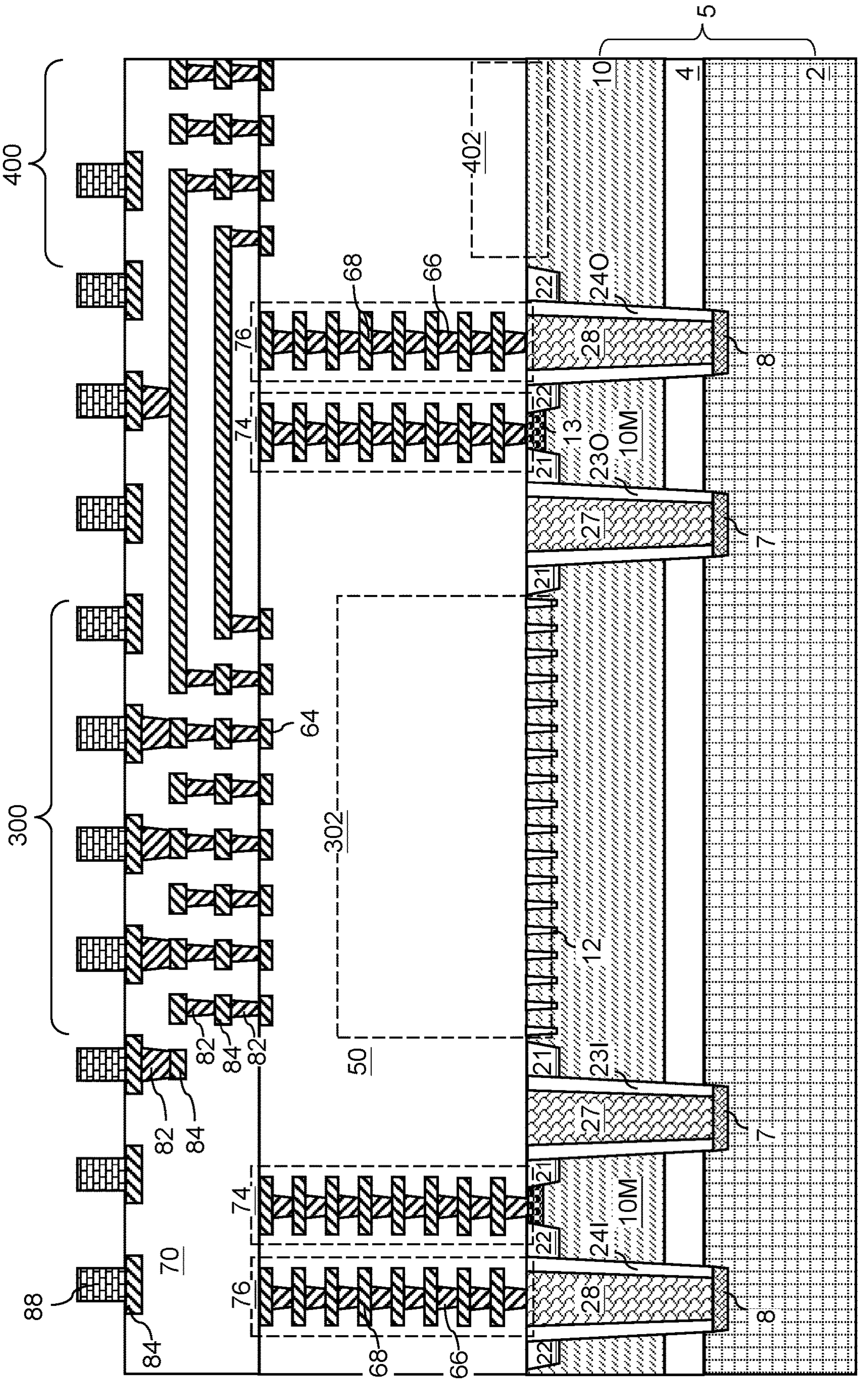
FIG. 7 is a vertical cross-sectional view of a third configuration of the exemplary structure according to an embodiment of the present disclosure.

Referring to FIG. 7, a third configuration of the exemplary structure according to an embodiment of the present disclosure may be derived from the first configuration of the exemplary structure illustrated in FIG. 5 by omitting formation of the inner metallic moat structure 72.

Figure 8:
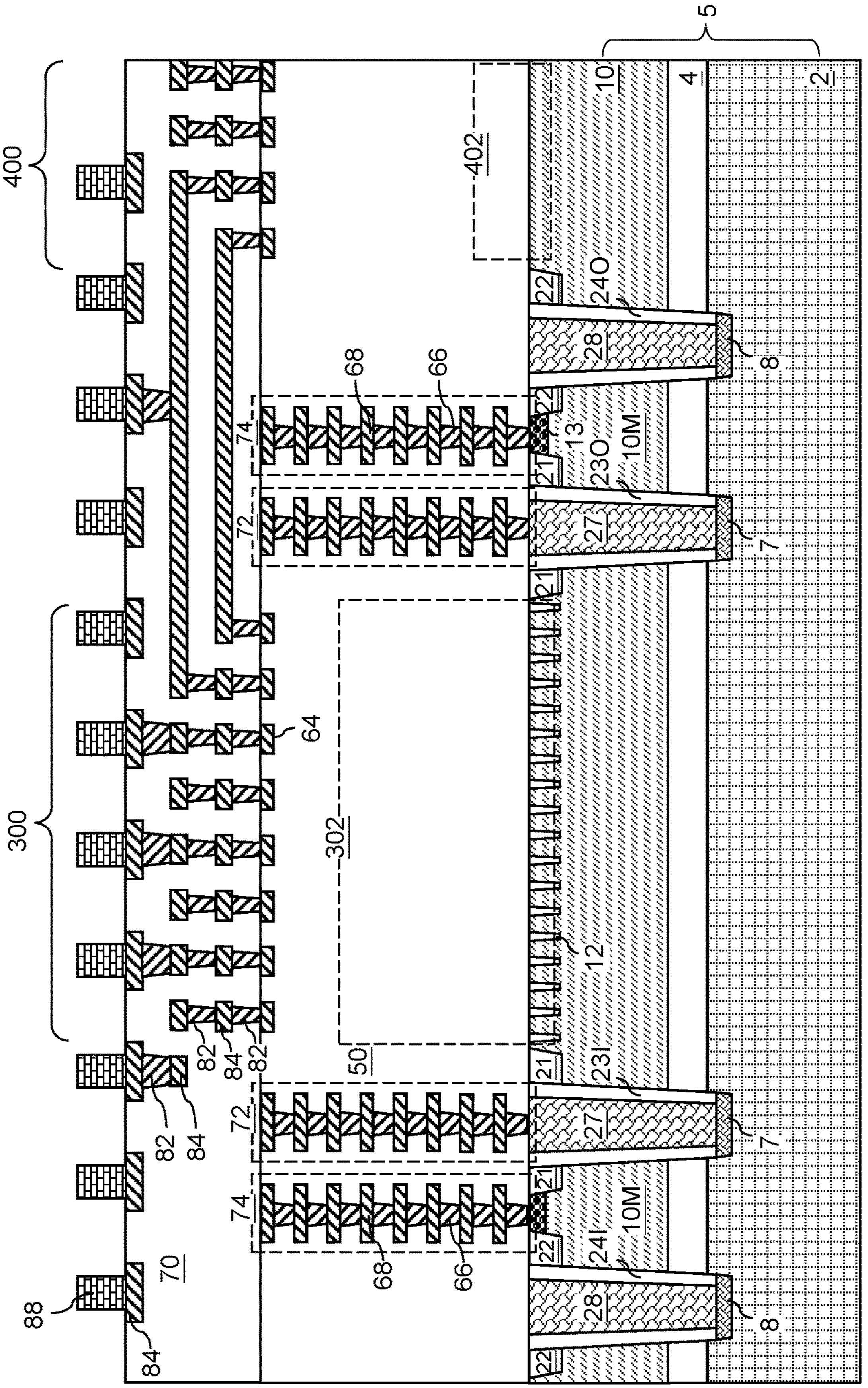
FIG. 8 is a vertical cross-sectional view of a fourth configuration of the exemplary structure according to an embodiment of the present disclosure.

Referring to FIG. 8, a fourth configuration of the exemplary structure according to an embodiment of the present disclosure may be derived from the first configuration of the exemplary structure illustrated in FIG. 5 by omitting formation of the outer metallic moat structure 76.

Figure 9:
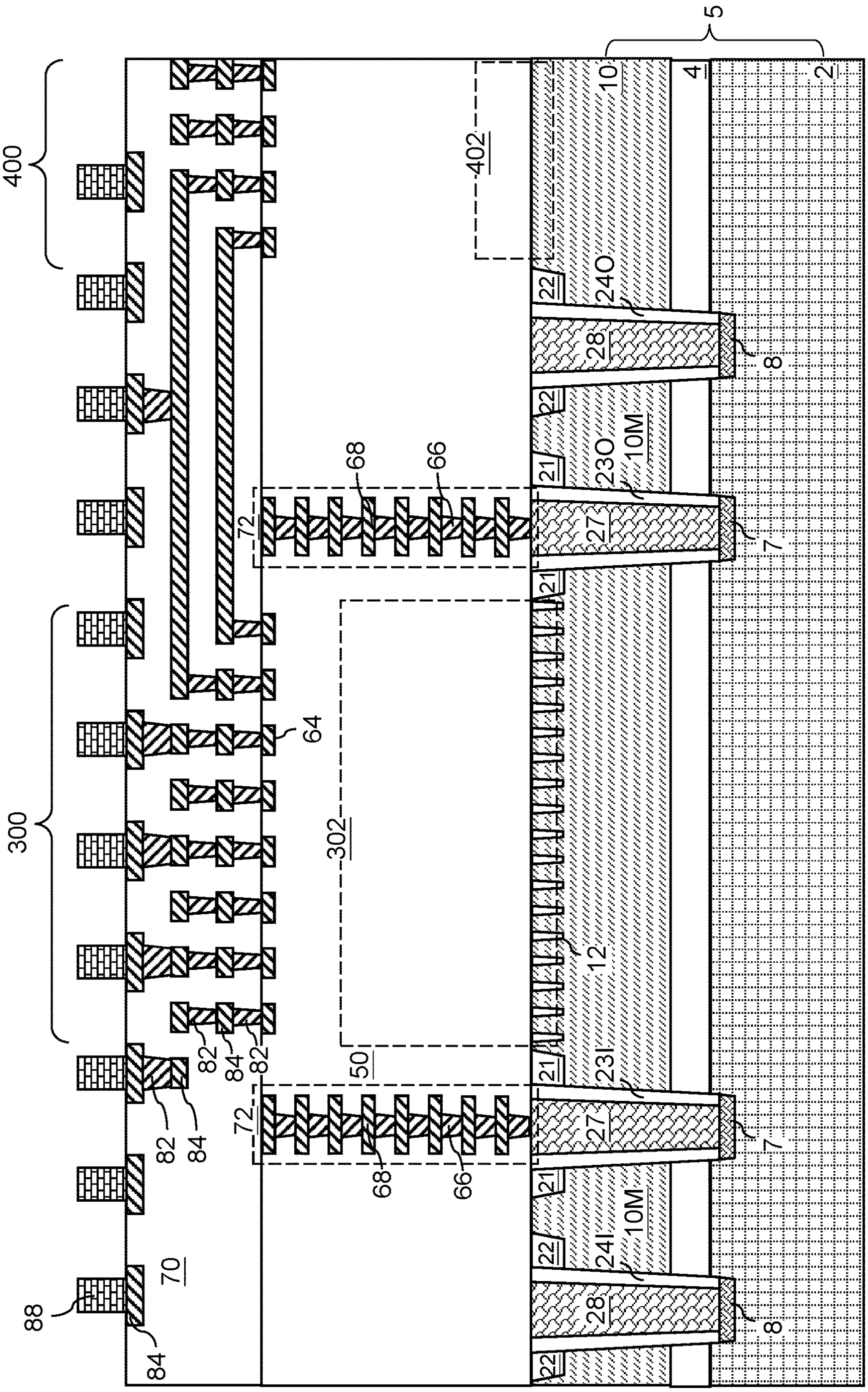
FIG. 9 is a vertical cross-sectional view of a fifth configuration of the exemplary structure according to an embodiment of the present disclosure.

Referring to FIG. 9, a fifth configuration of the exemplary structure according to an embodiment of the present disclosure may be derived from the first configuration of the exemplary structure illustrated in FIG. 5 by omitting formation of the outer metallic moat structure 76 and by omitting formation of the intermediate metallic moat structure 74. In this embodiment, formation of the heavily doped single crystalline semiconductor well 13 may be omitted.

Figure 10:
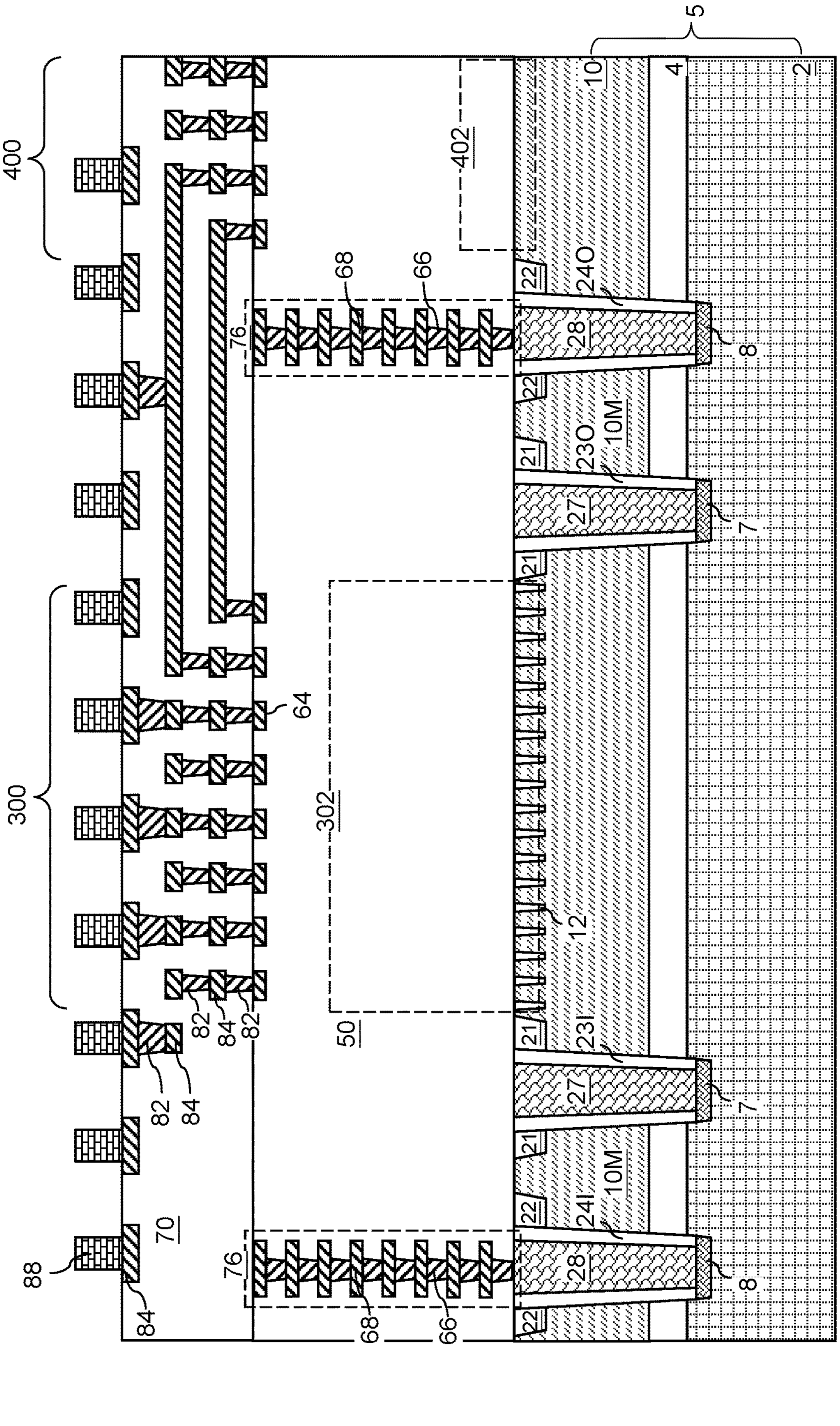
FIG. 10 is a vertical cross-sectional view of a sixth configuration of the exemplary structure according to an embodiment of the present disclosure.

Referring to FIG. 10, a sixth configuration of the exemplary structure according to an embodiment of the present disclosure may be derived from the first configuration of the exemplary structure illustrated in FIG. 5 by omitting formation of the inner metallic moat structure 72 and by omitting formation of the intermediate metallic moat structure 74. In this embodiment, formation of the heavily doped single crystalline semiconductor well 13 may be omitted.

Figure 11:
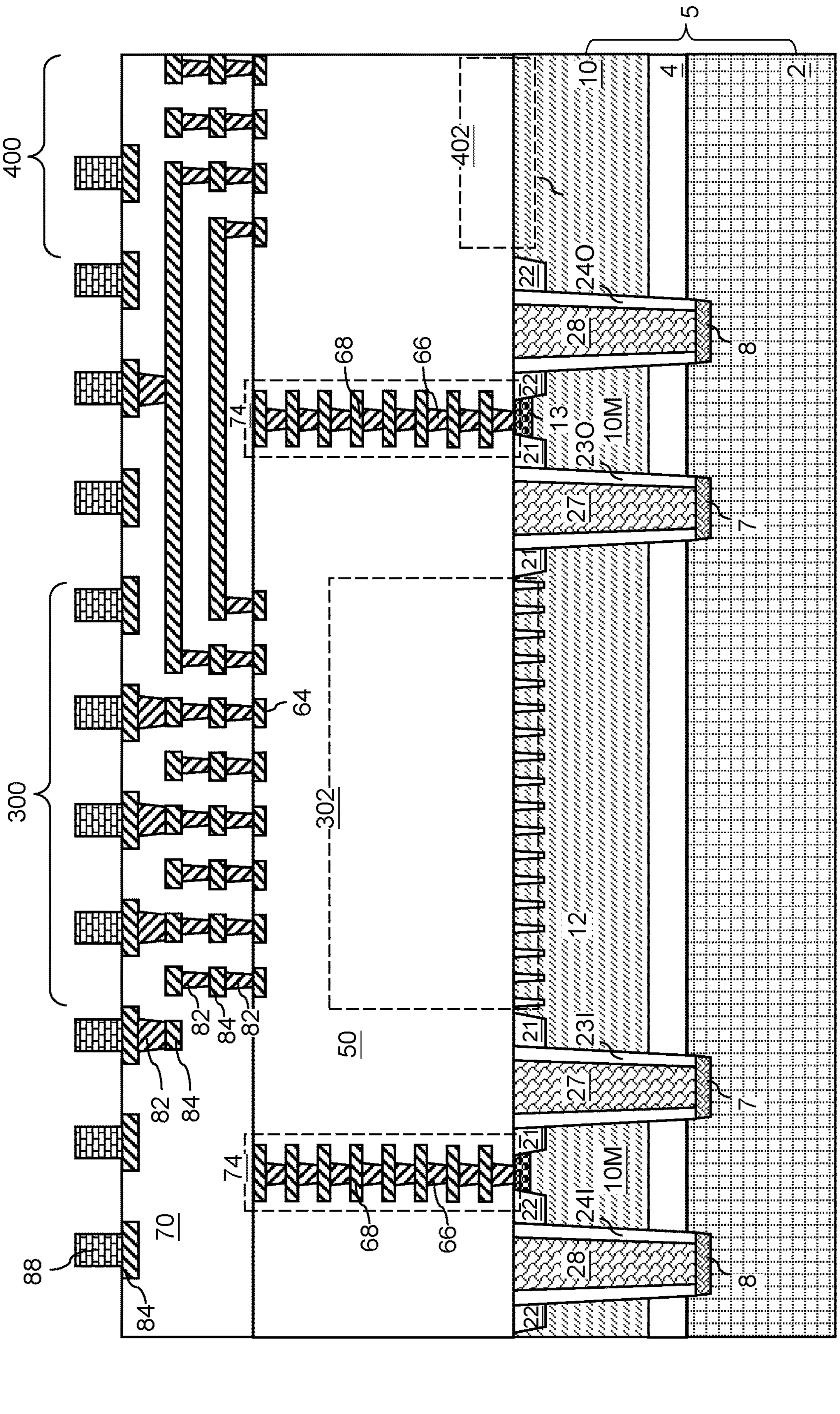
FIG. 11 is a vertical cross-sectional view of a seventh configuration of the exemplary structure according to an embodiment of the present disclosure.

Referring to FIG. 11, a seventh configuration of the exemplary structure according to an embodiment of the present disclosure may be derived from the first configuration of the exemplary structure illustrated in FIG. 5 by omitting formation of the inner metallic moat structure 72 and by omitting formation of the outer metallic moat structure 76.

Figure 12:
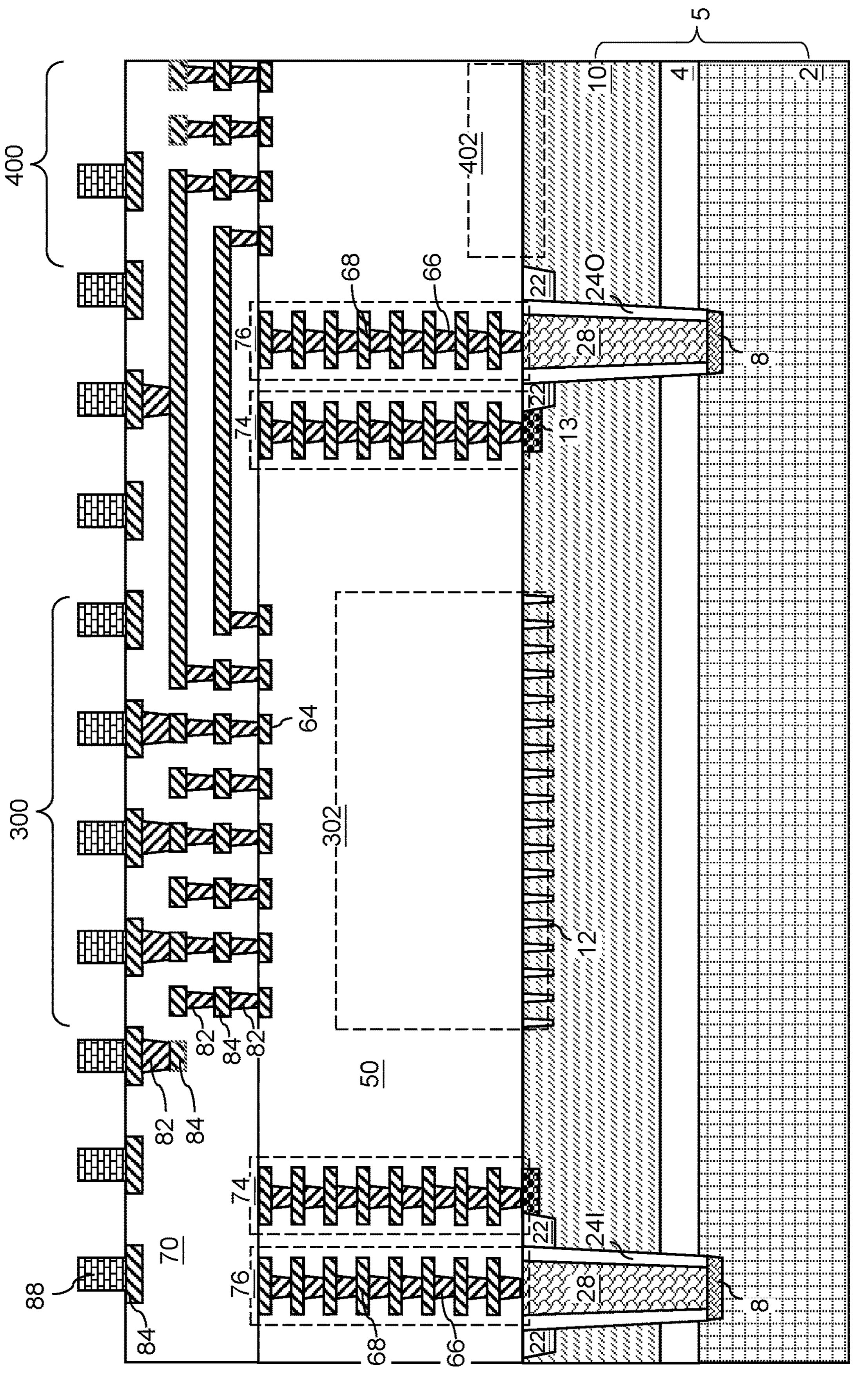
FIG. 12 is a vertical cross-sectional view of an eighth configuration of the exemplary structure according to an embodiment of the present disclosure.

Referring to FIG. 12, an eighth configuration of the exemplary structure according to an embodiment of the present disclosure may be derived from the second configuration of the exemplary structure illustrated in FIG. 7 by omitting formation of the inner deep trench isolation structure (27, 23I, 23O).

Figure 13:
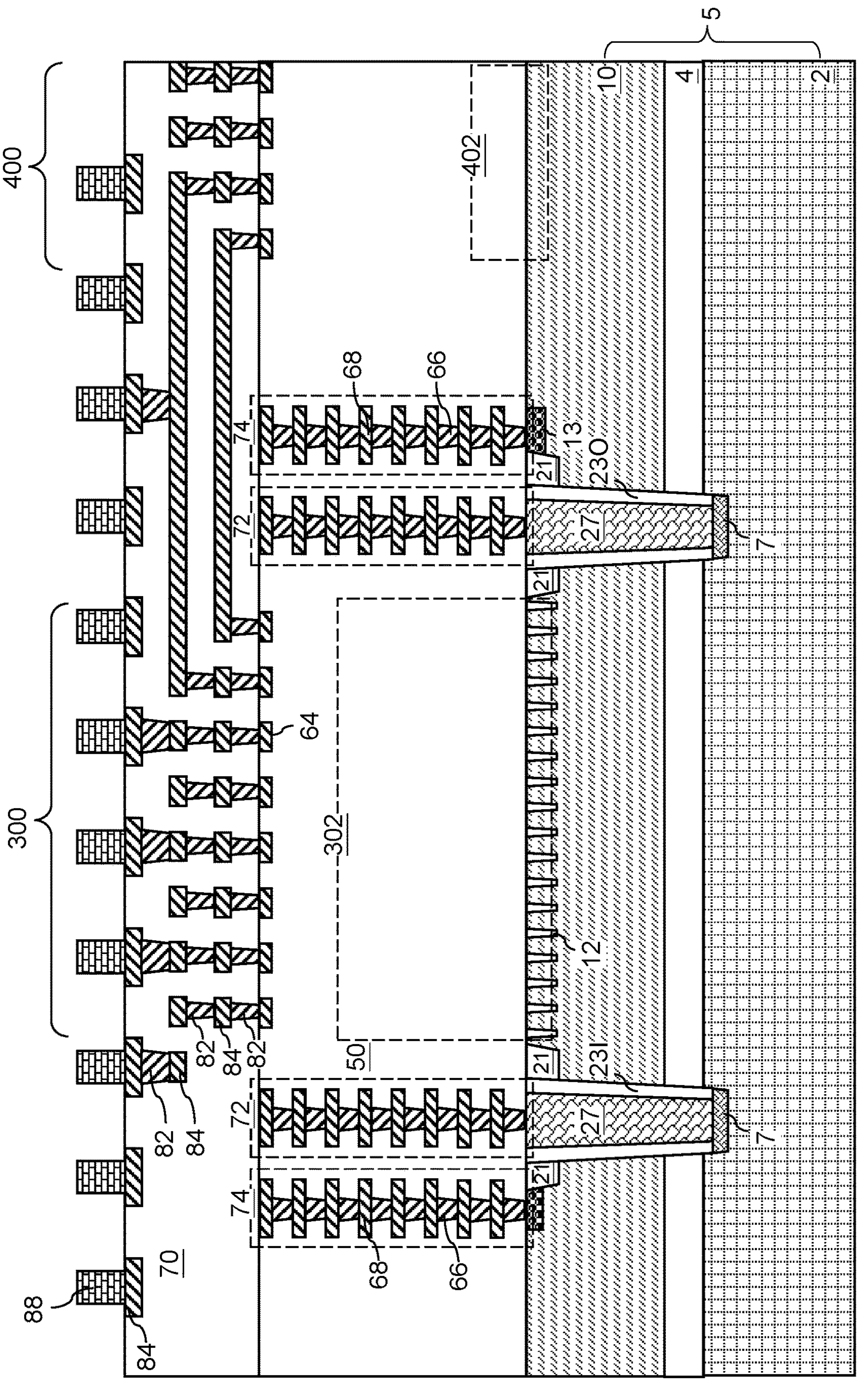
FIG. 13 is a vertical cross-sectional view of a ninth configuration of the exemplary structure according to an embodiment of the present disclosure.

Referring to FIG. 13, a ninth configuration of the exemplary structure according to an embodiment of the present disclosure may be derived from the third configuration of the exemplary structure illustrated in FIG. 8 by omitting formation of the outer deep trench isolation structure (28, 24I, 24O).

Figure 14:
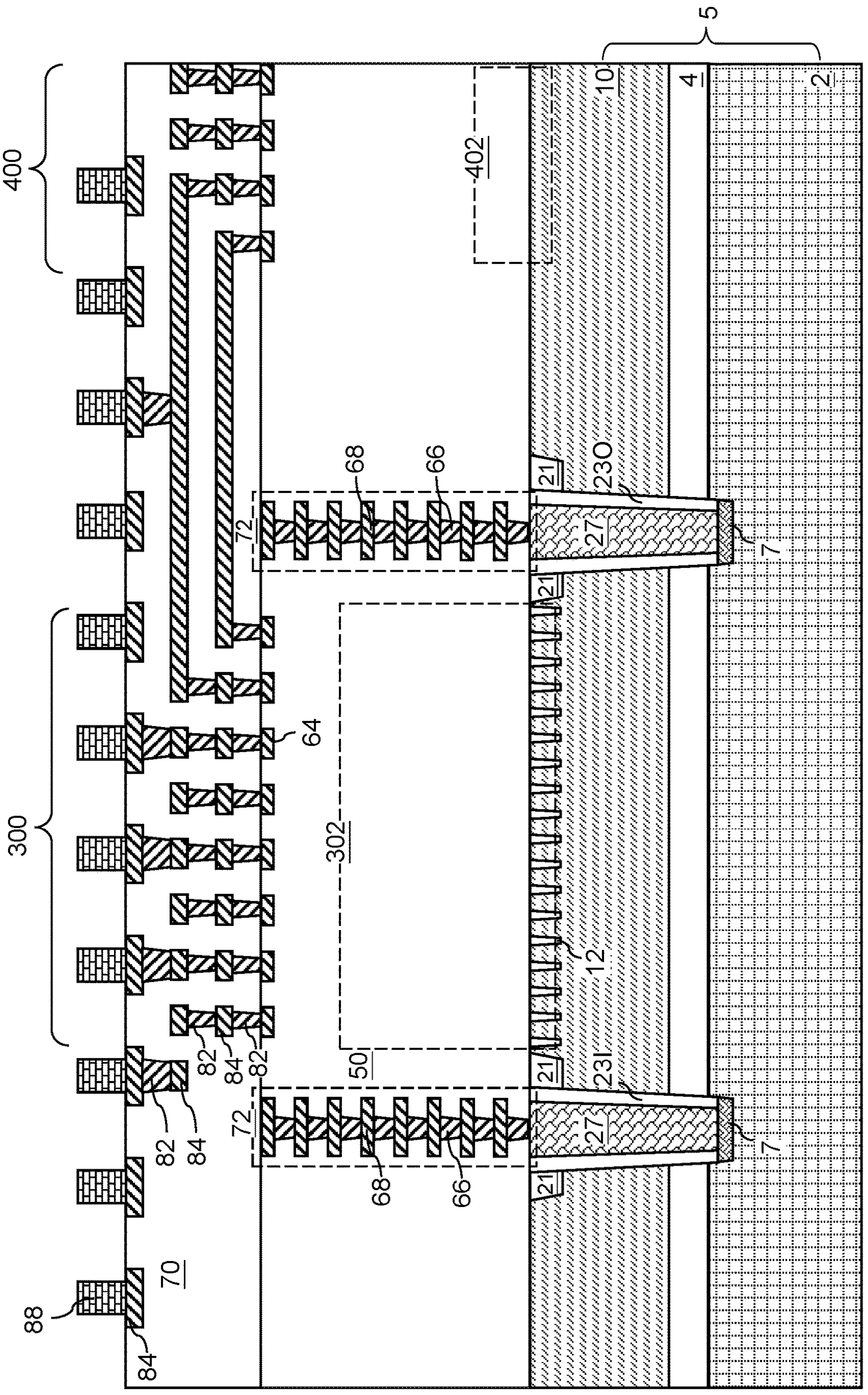
FIG. 14 is a vertical cross-sectional view of a tenth configuration of the exemplary structure according to an embodiment of the present disclosure.

Referring to FIG. 14, a tenth configuration of the exemplary structure according to an embodiment of the present disclosure may be derived from the ninth configuration of the exemplary structure illustrated in FIG. 13 by omitting formation of the intermediate metallic moat structure 74. In this embodiment, formation of the heavily doped single crystalline semiconductor well 13 may be omitted.

Figure 15:
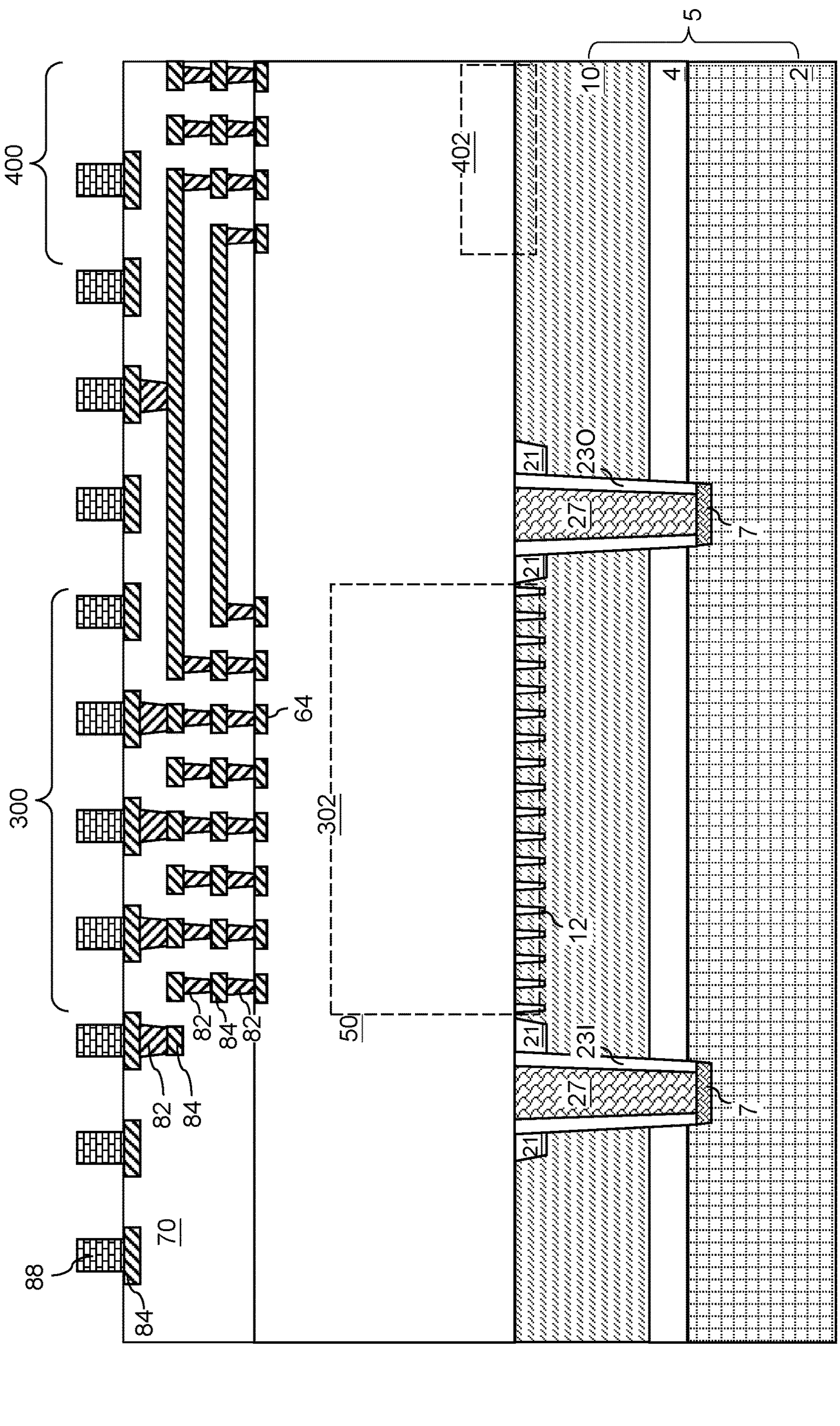
FIG. 15 is a vertical cross-sectional view of an eleventh configuration of the exemplary structure according to an embodiment of the present disclosure.

Referring to FIG. 15, an eleventh configuration of the exemplary structure according to an embodiment of the present disclosure may be derived from the tenth configuration of the exemplary structure illustrated in FIG. 14 by omitting formation of the inner metallic moat structure 72.

Figure 16:
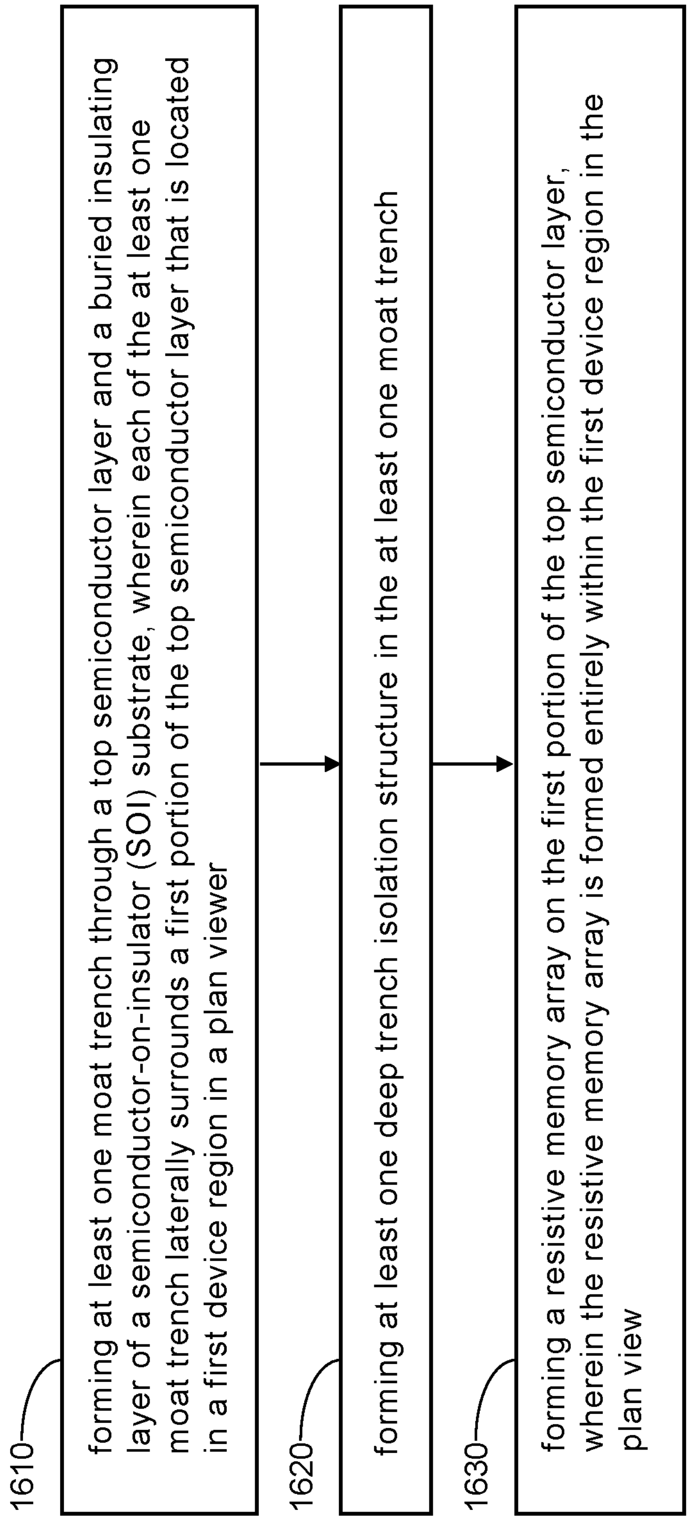
FIG. 16 is a flowchart illustrating steps for forming a semiconductor structure according to an embodiment of the present disclosure.

Referring to FIG. 16, a flowchart illustrates steps for forming a semiconductor structure according to an embodiment of the present disclosure.

Referring to step 1610 and FIGS. 1A, 1B, 2A, 2B, and 7-15, at least one moat trench (17, 18) may be formed through a top semiconductor layer 10 and a buried insulating layer 4 of a semiconductor-on-insulator (SOI) substrate 5. Each of the at least one moat trench (17, 18) laterally surrounds a first portion of the top semiconductor layer 10 that is located in a first device region 300 in a plan view.

Referring to step 1620 and FIGS. 3A, 3B, and 7-15, at least one deep trench isolation structure {(27, 23I, 23O) or (28, 24I, 24O)} may be formed in the at least one moat trench (17, 18).

Referring to step 1630 and FIGS. 4A-4C and 5-15, a resistive memory array 302 may be formed on the first portion of the top semiconductor layer 10. The resistive memory array 302 is formed entirely within the first device region 300 in the plan view.

The various embodiments of the present disclosure may be used to provide a semiconductor structure including a resistive memory array 302 that is electrically shielded from external electromagnetic noise through at least one deep trench isolation structure {(27, 23I, 23O), (28, 24I, 24O)} and/or at least one metallic moat structure (72, 74, 76). The at least one deep trench isolation structure {(27, 23I, 23O), (28, 24I, 24O)} and/or at least one metallic moat structure (72, 74, 76), and particularly in combination, may provide excellent electromagnetic noise shielding from all lateral directions. Thus, noise immunity of the resistive memory devices 30 in the resistive memory array 302 may be enhanced.

The foregoing outlines features of several embodiments so that those skilled in the art may better understand the aspects of the present disclosure. Each embodiment described using the term "comprises" also inherently discloses that the term "comprises" may be replaced with "consists essentially of" or with the term "consists of" in some embodiments, unless expressly disclosed otherwise herein. Whenever two or more elements are listed as alternatives in a same paragraph of in different paragraphs, a Markush group including a listing of the two or more elements may be also impliedly disclosed in some embodiments. Whenever the auxiliary verb "can" is used in this disclosure to describe formation of an element or performance of a processing step, an embodiment in which such an element or such a processing step is not performed is also expressly contemplated, provided that the resulting apparatus or device may provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
- a semiconductor-on-insulator (SOI) substrate comprising a handle substrate, a buried insulating layer, and a top semiconductor layer;
- a first deep trench isolation structure that vertically extends through the top semiconductor layer and the buried insulating layer, and comprises:
  - a first inner insulating liner laterally surrounding a first portion of the top semiconductor layer that is located in a first device region in a plan view;
  - a first non-insulating moat structure laterally surrounding the first inner insulating liner and having a top surface located at, or below, a horizontal plane including a top surface of the top semiconductor layer; and
  - a first outer insulating liner that laterally surrounds the first non-insulating moat structure; and
- a resistive memory array located on the first portion of the top semiconductor layer, and located entirely within the first device region in the plan view.

2. The semiconductor structure of claim 1, wherein each resistive memory device within the resistive memory array comprises:
- a resistive memory cell comprising:
  - a first electrode;
  - a resistive memory element comprising a material having at least two different resistive states;
  - a second electrode; and
- an access transistor comprising a drain region that is electrically connected to the first electrode of the resistive memory cell.

3. The semiconductor structure of claim 2, further comprising a shallow trench isolation grid embedded within an upper region of the first portion of the top semiconductor layer and laterally surrounding active regions of the access transistors of the resistive memory array.

4. The semiconductor structure of claim 2, further comprising:
- source lines electrically connected to source regions of a respective subset of the access transistors within the resistive memory array and located entirely within the first device region in the plan view; and
- bit lines electrically connected to second electrodes of a respective column of the second electrodes within the resistive memory array and located entirely within the first device region in the plan view.

5. The semiconductor structure of claim 1, further comprising a first metallic moat structure laterally surrounding the resistive memory array and vertically extending from a top surface of the top semiconductor layer or from the top surface of the first non-insulating moat structure to a horizontal plane that overlies topmost surfaces of the resistive memory cells within the resistive memory array, wherein the first metallic moat structure contacts the top surface of the top semiconductor layer or the top surface of the first non-insulating moat structure.

6. The semiconductor structure of claim 5, wherein the first metallic moat structure comprises a vertically alternating sequence of via-level metallic wall structures and line-level metallic wall structures.

7. The semiconductor structure of claim 5, further comprising:
- peripheral devices for controlling operation of the resistive memory devices in the resistive memory array and located in a second device region that is located entirely outside the first device region and outside an outer periphery of the first deep trench isolation structure; and
- upper-level metal interconnect structures extending over the first metallic moat structure and providing electrically conductive paths between the peripheral devices and the resistive memory array.

8. The semiconductor structure of claim 5, wherein an entirety of a bottom surface of the first metallic moat structure is in contact with a top surface of the first non-insulating moat structure.

9. The semiconductor structure of claim 5, wherein an entirety of a bottom surface of the first metallic moat structure is in contact with a top surface of a portion of the top semiconductor layer that is located outside the first deep trench isolation structure.

10. The semiconductor structure of claim 5, wherein an entirety of a bottom surface of the first metallic moat structure is in contact with a top surface of a portion of the top semiconductor layer that is located inside the first deep trench isolation structure.

11. The semiconductor structure of claim 5, further comprising a second metallic moat structure laterally surrounding the resistive memory array and vertically extending from the top surface of the SOI substrate to the horizontal plane, wherein the second metallic moat structure laterally surrounds, or is laterally surrounded by, the first metallic moat structure.

12. A semiconductor structure comprising:

a semiconductor-on-insulator (SOI) substrate comprising a handle substrate, a buried insulating layer, and a top semiconductor layer;

a first deep trench isolation structure comprising a first non-insulating moat structure laterally surrounding a first portion of the top semiconductor layer that is located in a first device region in a plan view, wherein the first non-insulating moat structure has a top surface located at, or below, a horizontal plane including a top surface of the top semiconductor layer;

a second deep trench isolation structure comprising a second non-insulating moat structure laterally surrounding the first deep trench isolation structure in the plan view; and a resistive memory array located on the first portion of the top semiconductor layer, and located entirely within the first device region in the plan view.

13. The semiconductor structure of claim 12, further comprising a first metallic moat structure laterally surrounding the resistive memory array and vertically extending from a top surface of the SOI substrate to a horizontal plane that overlies topmost surfaces of resistive memory cells within the resistive memory array.

14. The semiconductor structure of claim 13, wherein the first metallic moat structure contacts a top surface of a deep trench isolation structure that is selected from the first deep trench isolation structure and the second deep trench isolation structure.

15. The semiconductor structure of claim 13, wherein an entirety of a bottom surface of the first metallic moat structure is in contact with a top surface of a portion of the top semiconductor layer.

16. The semiconductor structure of claim 12, further comprising:

a first metallic moat structure laterally surrounding the resistive memory array and vertically extending from a top surface of the top semiconductor layer or from the top surface of the first non-insulating moat structure to a horizontal plane that overlies topmost surfaces of the resistive memory cells within the resistive memory array, wherein the first metallic moat structure contacts the top surface of the top semiconductor layer or the top surface of the first non-insulating moat structure;

peripheral devices for controlling operation of the resistive memory devices in the resistive memory array and located in a second device region that is located entirely outside the first device region and outside an outer periphery of the first deep trench isolation structure; and upper-level metal interconnect structures extending over the first metallic moat structure and providing electrically conductive paths between the peripheral devices and the resistive memory array.

17. A method of forming a semiconductor structure, the method comprising:

forming at least one moat trench through a top semiconductor layer and a buried insulating layer of a semiconductor-on-insulator (SOI) substrate, wherein each of the at least one moat trench laterally surrounds a first portion of the top semiconductor layer that is located in a first device region in a plan view;

forming at least one deep trench isolation structure in the at least one moat trench such that one of the at least one deep trench isolation structure comprises:

a first inner insulating liner laterally surrounding the first portion of the top semiconductor layer;

a first non-insulating moat structure laterally surrounding the first inner insulating liner and having a top surface located at, or below, a horizontal plane including a top surface of the top semiconductor layer; and a first outer insulating liner that laterally surrounds the first non-insulating moat structure; and forming a resistive memory array on the first portion of the top semiconductor layer, wherein the resistive memory array is formed entirely within the first device region in the plan view.

18. The method of claim 17, wherein forming the resistive memory array comprises:

forming an array of access transistors such that active regions of the array of access transistors are formed within the first portion of the top semiconductor layer;

forming first metal interconnect structures embedded in first dielectric material layers over the array of access transistors, wherein the first metal interconnect structures are electrically connected to the array of access transistors; and forming resistive memory cells on a subset of the first metal interconnect structures, wherein each of the resistive memory cells comprises a first electrode, a resistive memory element comprising a material that provides at least two different resistive states; and a second electrode.

19. The method of claim 18, further comprising forming a shallow trench isolation grid within an upper region of the first portion of the top semiconductor layer and laterally surrounding an array of active regions which are patterned segments of the first portion of the top semiconductor layer, wherein source regions and drain regions of the array of access transistors are formed within the array of active regions.

20. The method of claim 16, further comprising:

forming peripheral devices in a second device region that is located entirely outside the first device region and outside an outermost periphery of the at least one deep trench isolation structure, wherein the peripheral devices are configured to control operation of resistive memory devices in the resistive memory array;

forming lower-level metal interconnect structures embedded in lower-level dielectric material layers over the at least one deep trench isolation structure and over the peripheral devices, wherein the lower-level metal interconnect structures comprise source lines and bit lines that are formed entirely within the first device region in the plan view, wherein a top surface of the first metallic moat structure is formed in a horizontal plane including a topmost surface of the lower-level dielectric material layers;

forming a first metallic moat structure laterally surrounding the resistive memory array, wherein the first metallic moat structure vertically extends from a top surface of the SOI substrate or from a top surface of the at least one deep trench isolation structure to a horizontal plane that overlies topmost surfaces of resistive memory cells within the resistive memory array; and forming upper-level metal interconnect structures embedded in upper-level dielectric material layers, wherein a subset of the upper-level metal interconnect structures laterally extends over the first metallic moat structure and provides electrically conductive paths between the peripheral devices and the resistive memory array.

* * * * *